US009929750B2

(12) United States Patent
Kaku et al.

(10) Patent No.: US 9,929,750 B2
(45) Date of Patent: Mar. 27, 2018

(54) MEMORY SYSTEM

(71) Applicant: TOSHIBA MEMORY CORPORATION, Minato-ku (JP)

(72) Inventors: Erika Kaku, Kawasaki (JP); Yoshihisa Kojima, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 6 days.

(21) Appl. No.: 15/067,958

(22) Filed: Mar. 11, 2016

(65) Prior Publication Data

US 2017/0070241 A1    Mar. 9, 2017

Related U.S. Application Data

(60) Provisional application No. 62/215,560, filed on Sep. 8, 2015.

(51) Int. Cl.
G06F 11/10 (2006.01)
H03M 13/29 (2006.01)
G11C 29/52 (2006.01)
H03M 13/09 (2006.01)
H03M 13/11 (2006.01)
H03M 13/15 (2006.01)

(52) U.S. Cl.
CPC ..... H03M 13/2906 (2013.01); G06F 11/1068 (2013.01); G11C 29/52 (2013.01); H03M 13/09 (2013.01); H03M 13/1102 (2013.01); H03M 13/152 (2013.01); H03M 13/1515 (2013.01)

(58) Field of Classification Search
CPC .................................................... G06F 11/1008
USPC ........................................ 714/763, 767, 768
See application file for complete search history.

(56) References Cited

U.S. PATENT DOCUMENTS

| 2009/0319870 | A1  | 12/2009 | Yamada et al. |
| 2014/0143634 | A1  | 5/2014  | Post |
| 2014/0149826 | A1  | 5/2014  | Lu et al. |
| 2014/0258805 | A1* | 9/2014  | Casado ............... H03M 13/35 714/758 |
| 2016/0118088 | A1* | 4/2016  | Lee ...................... G11C 8/12 365/189.05 |
| 2016/0378592 | A1* | 12/2016 | Ikegami .............. G06F 12/0893 714/764 |
| 2017/0063394 | A1* | 3/2017  | Halbert .............. G06F 11/1068 |

* cited by examiner

Primary Examiner — Fritz Alphonse
(74) Attorney, Agent, or Firm — Oblon, McClelland, Maier & Neustadt, L.L.P.

(57) ABSTRACT

According to one embodiment, a memory system includes a first volatile memory, a nonvolatile memory and a controller. The nonvolatile memory includes a plurality of chips. The controller generates a second error correcting code using data stored in the first volatile memory. The second error correcting code is a code for correcting data which cannot be corrected included in a first data group using a first error correcting code. The controller releases an area of the first volatile memory corresponding to the first data group written in the nonvolatile memory, before completion of writing of all of the data which are stored in the first volatile memory and includes in a codeword of the second error correcting code to the nonvolatile memory.

20 Claims, 26 Drawing Sheets

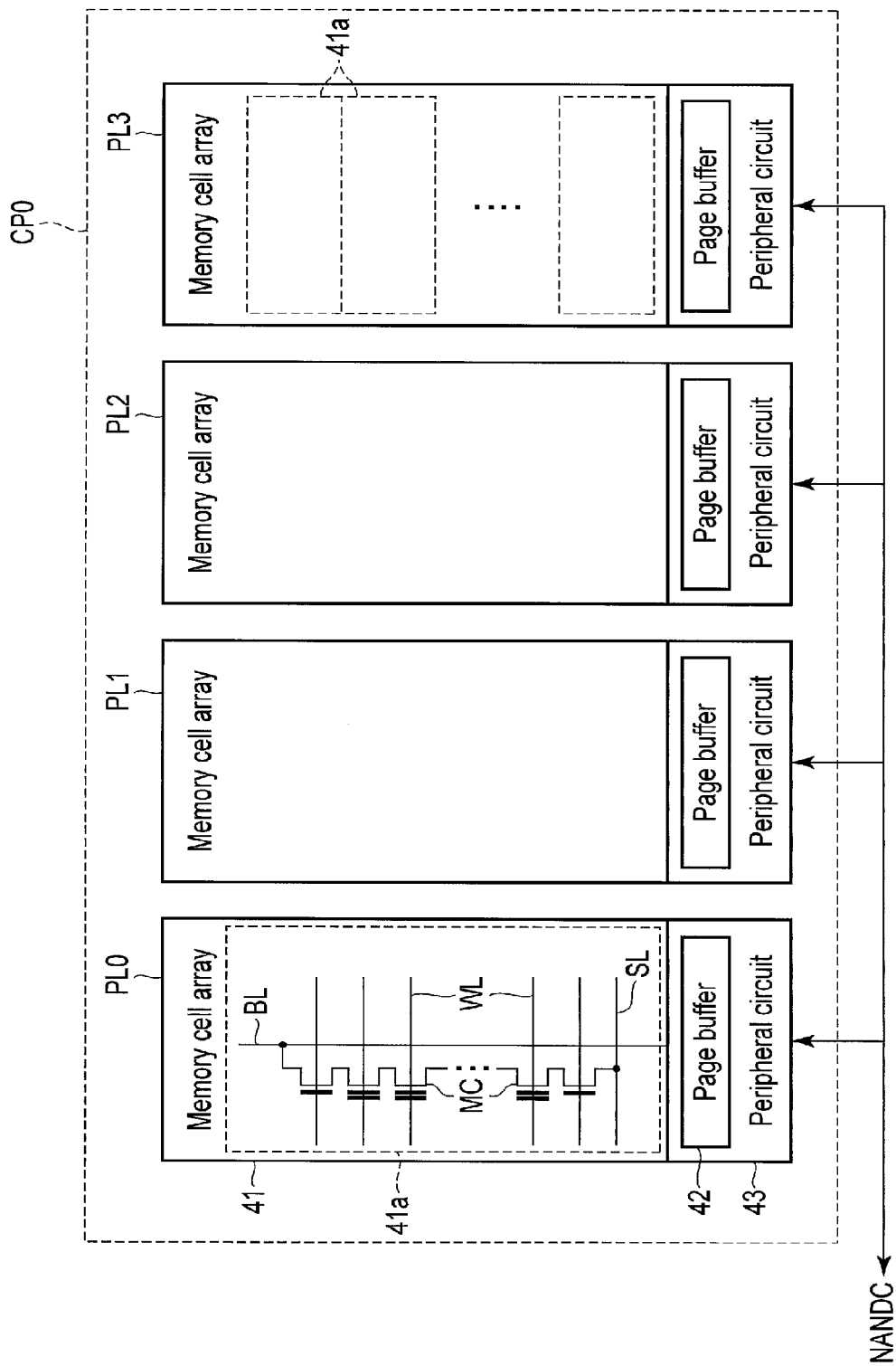
F I G. 2

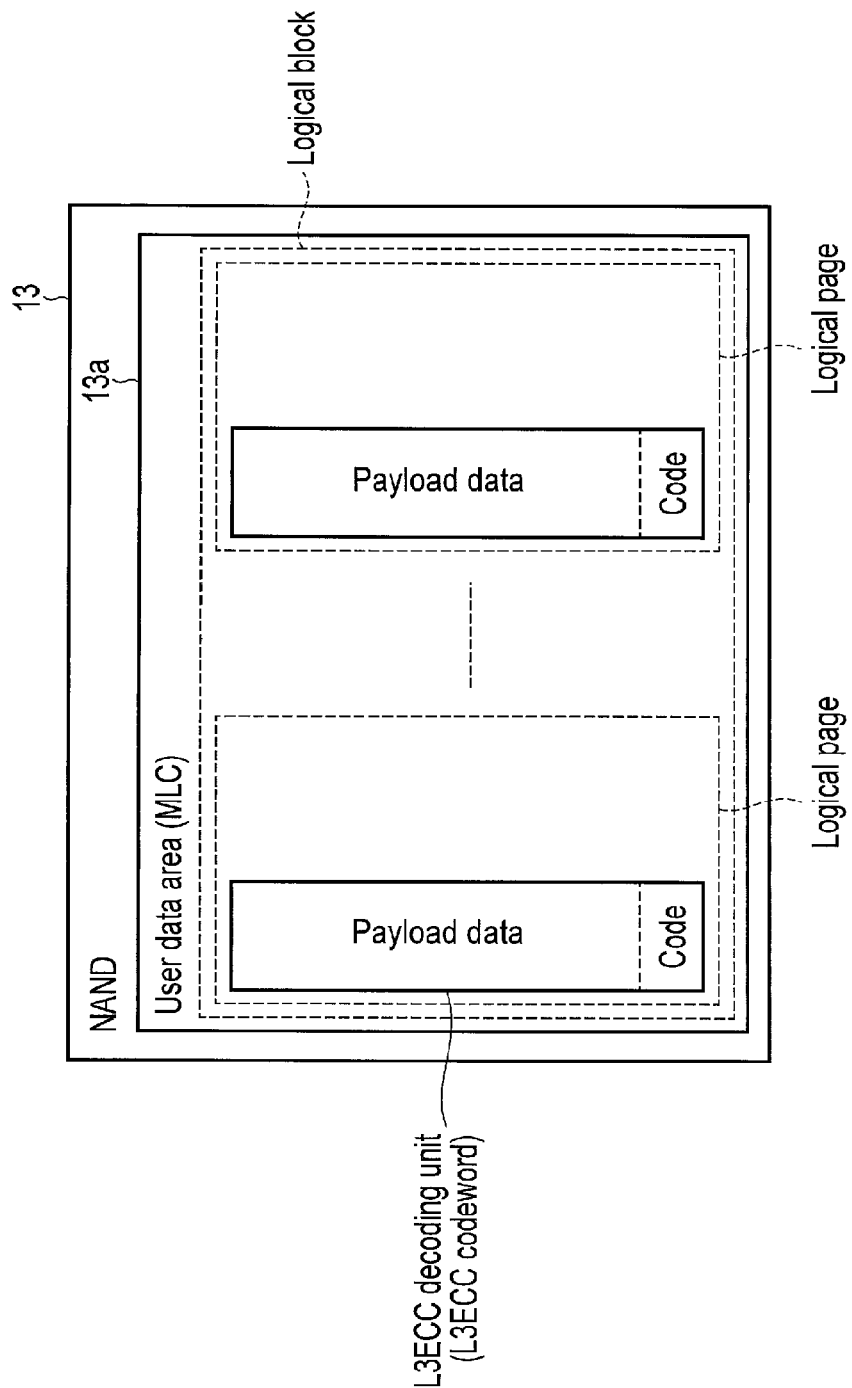
F I G. 5

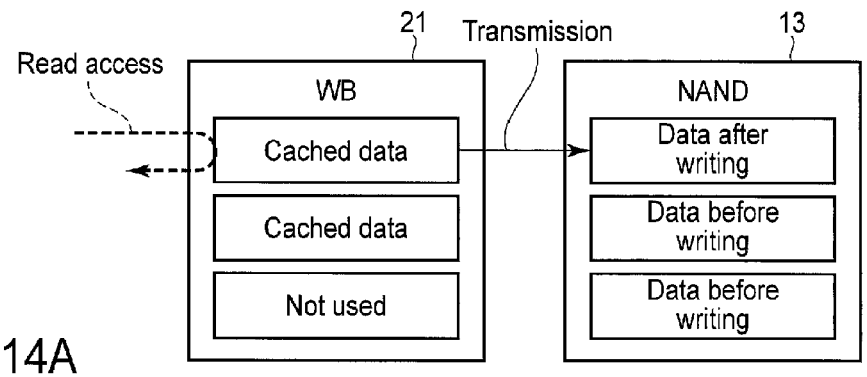
F I G. 14A
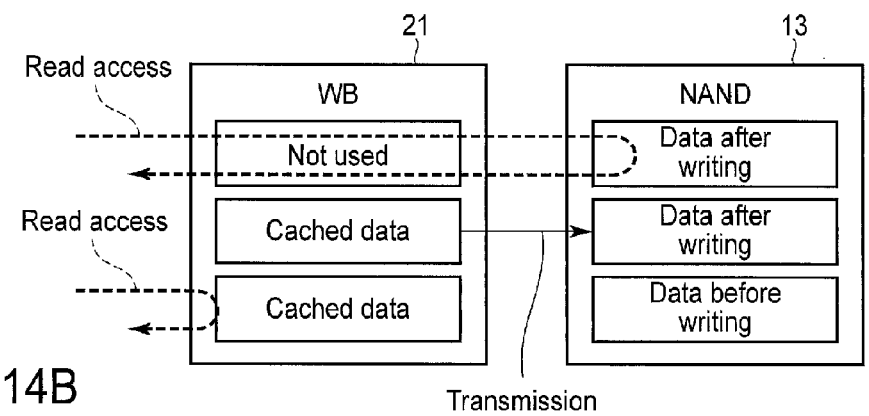
F I G. 14B
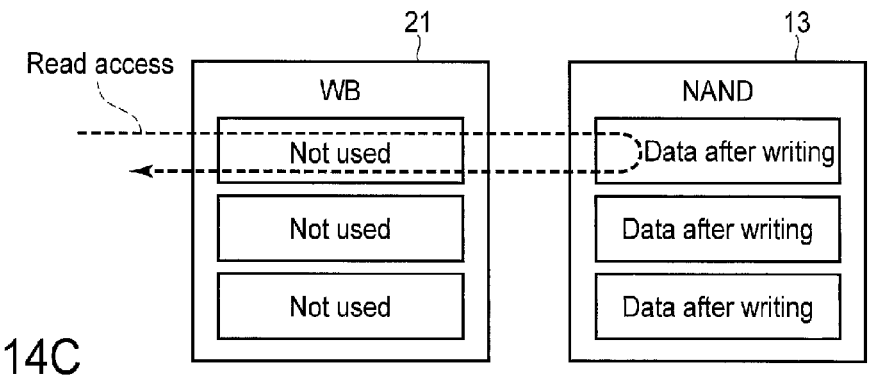
F I G. 14C

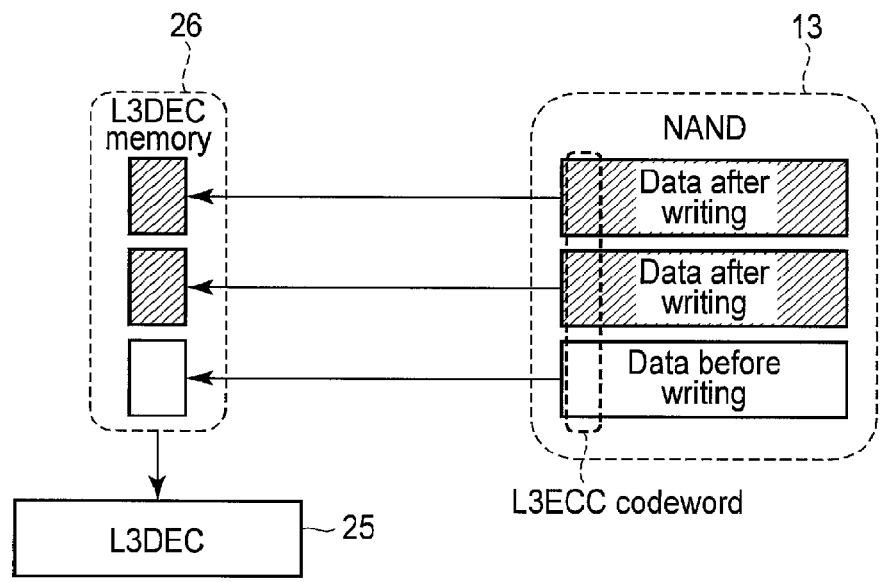
F I G. 15A
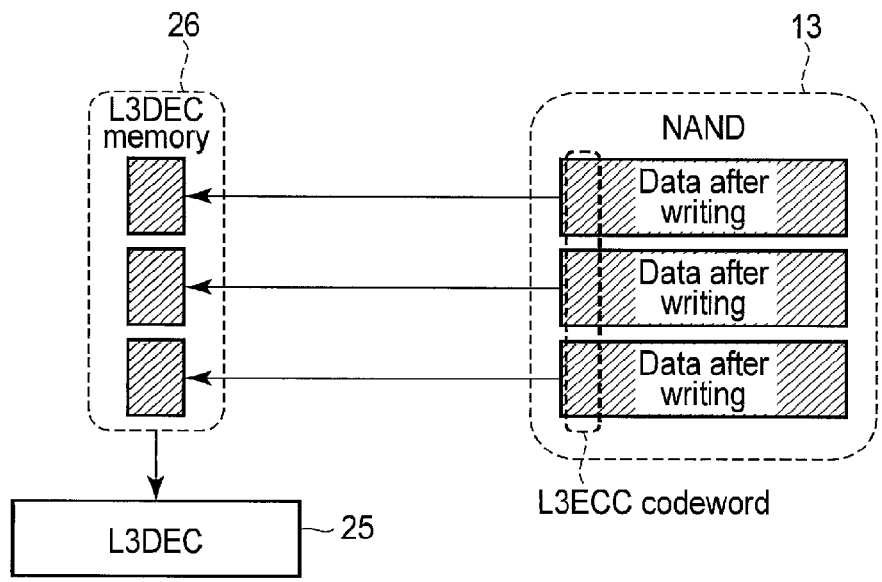
F I G. 15B

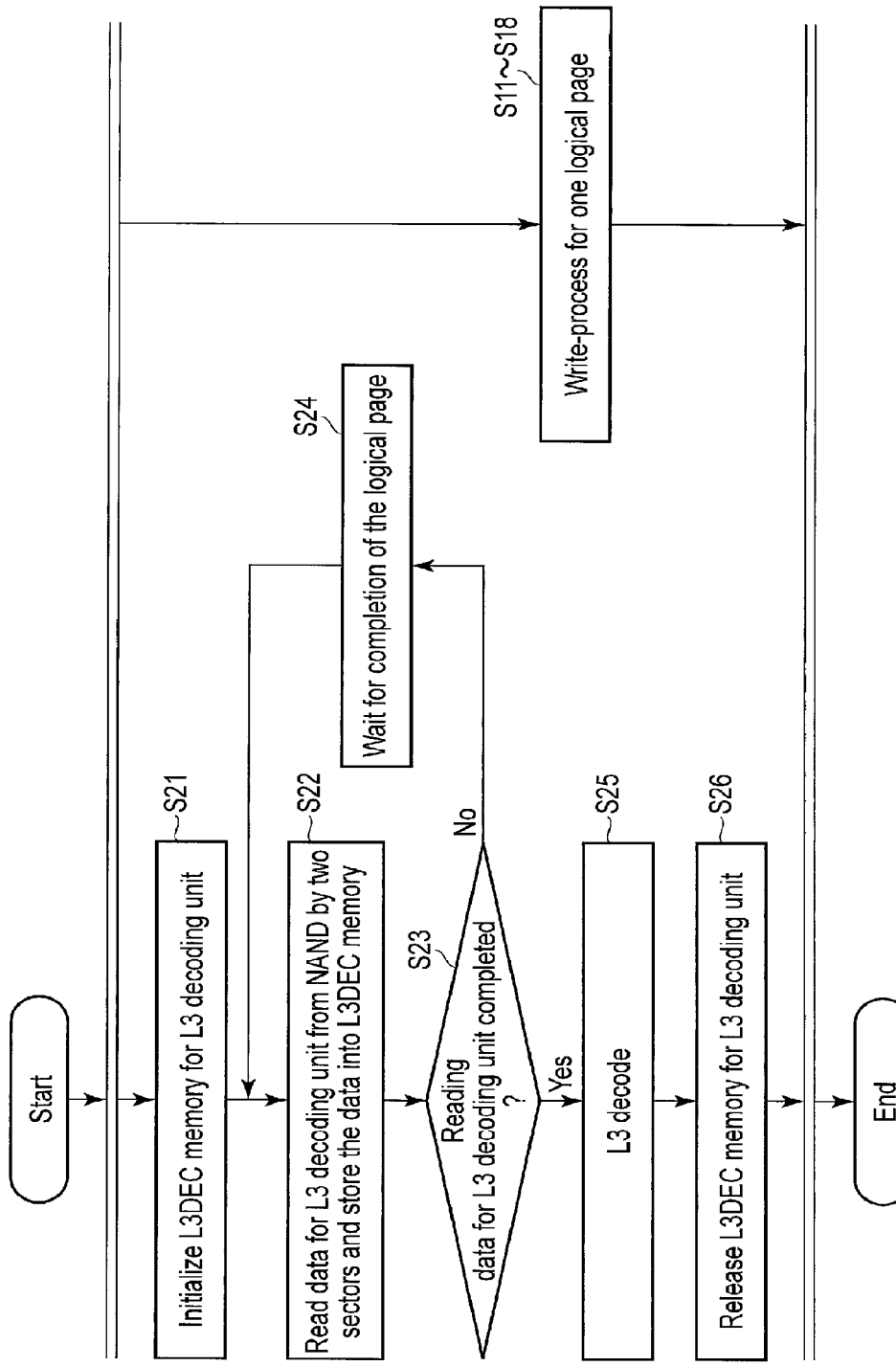
F I G. 16

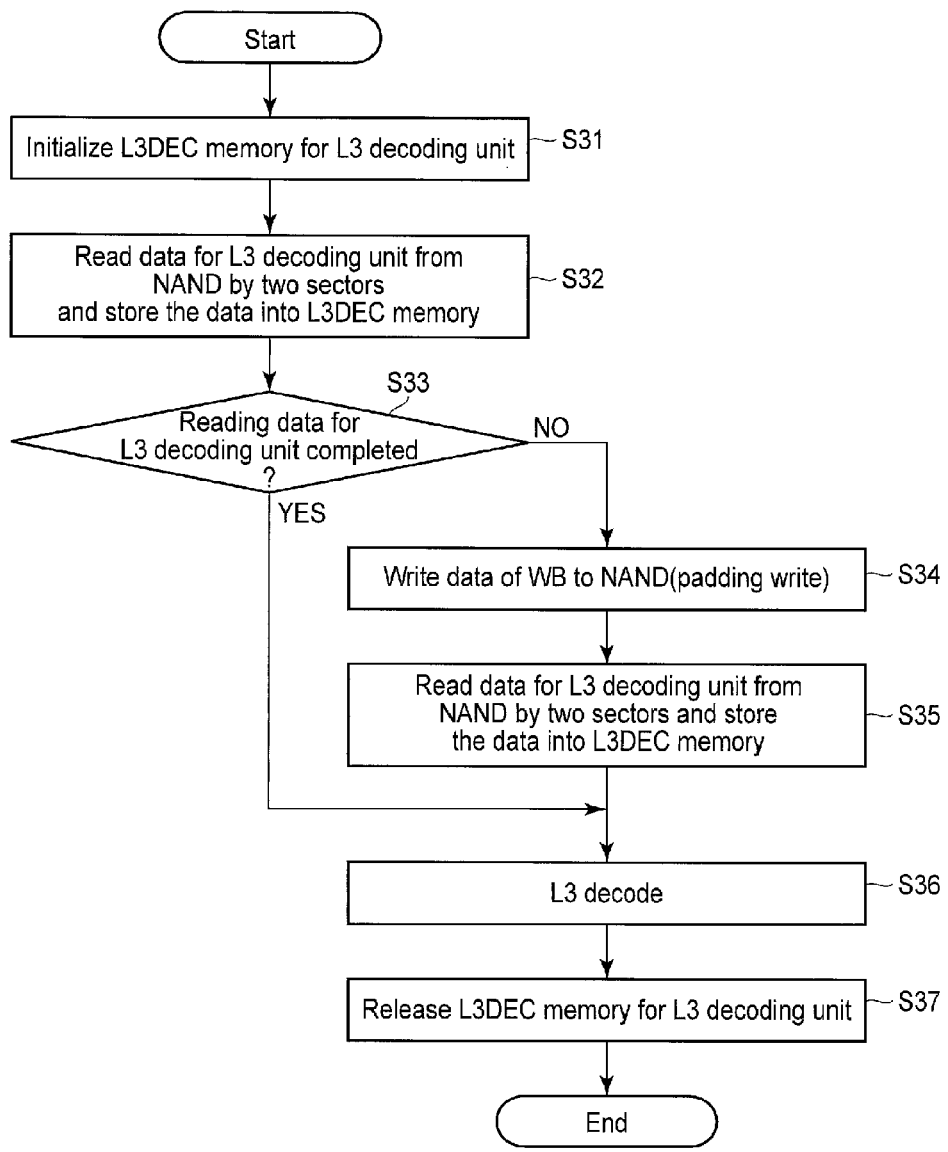
F I G. 18

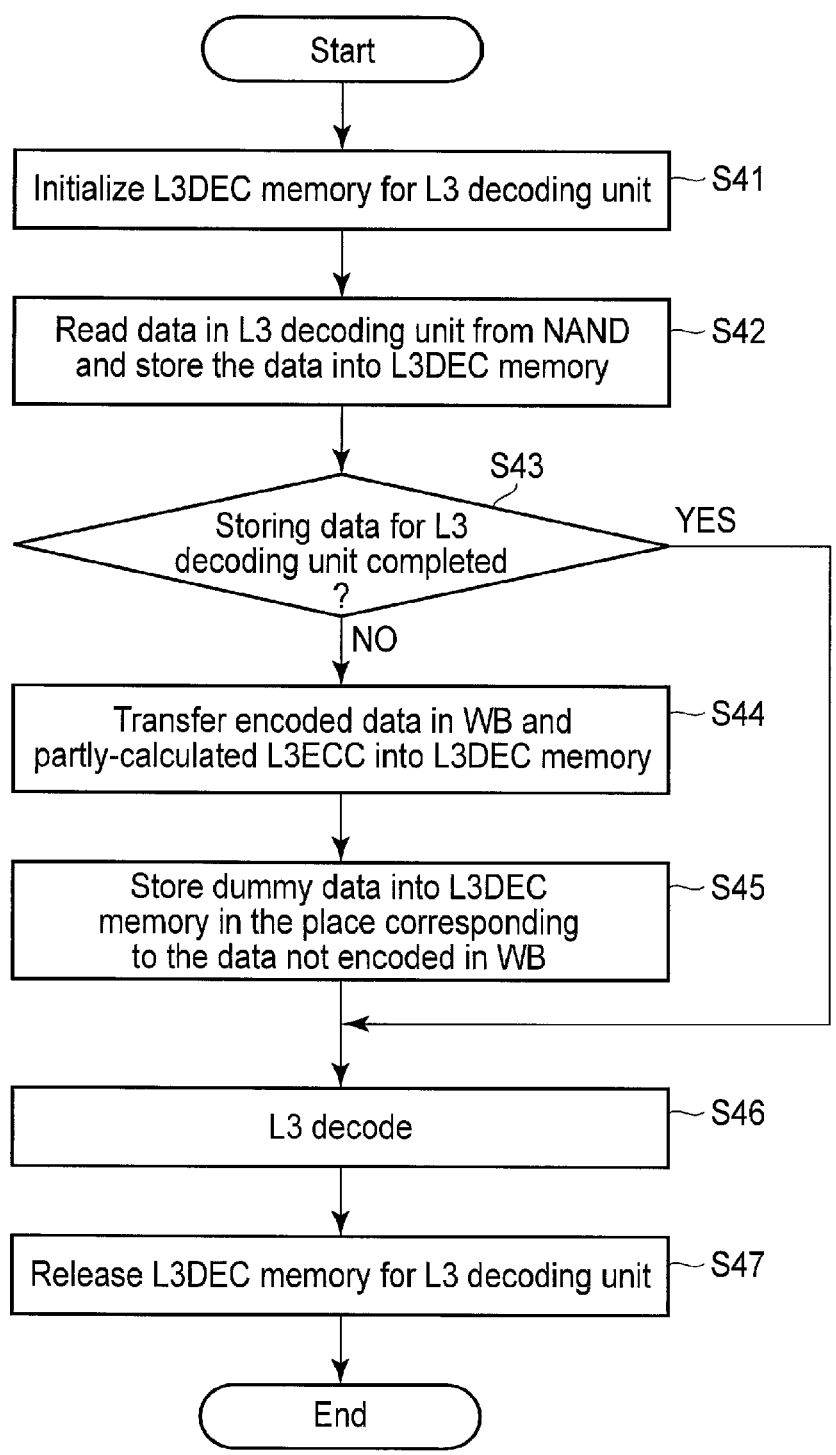
F I G. 20

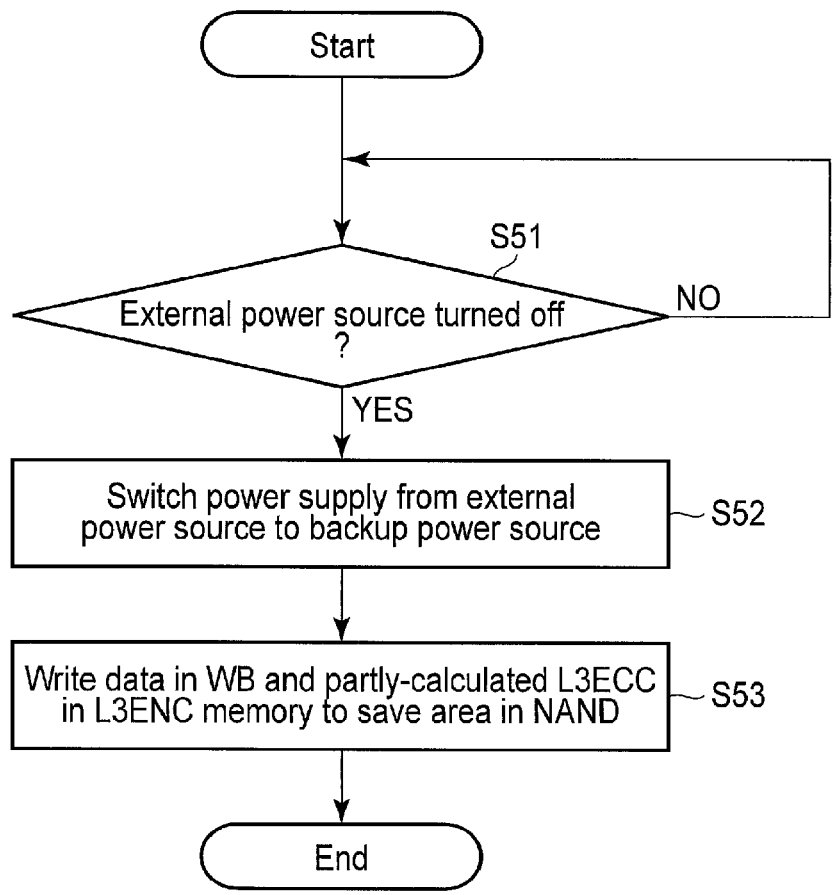
F I G. 21

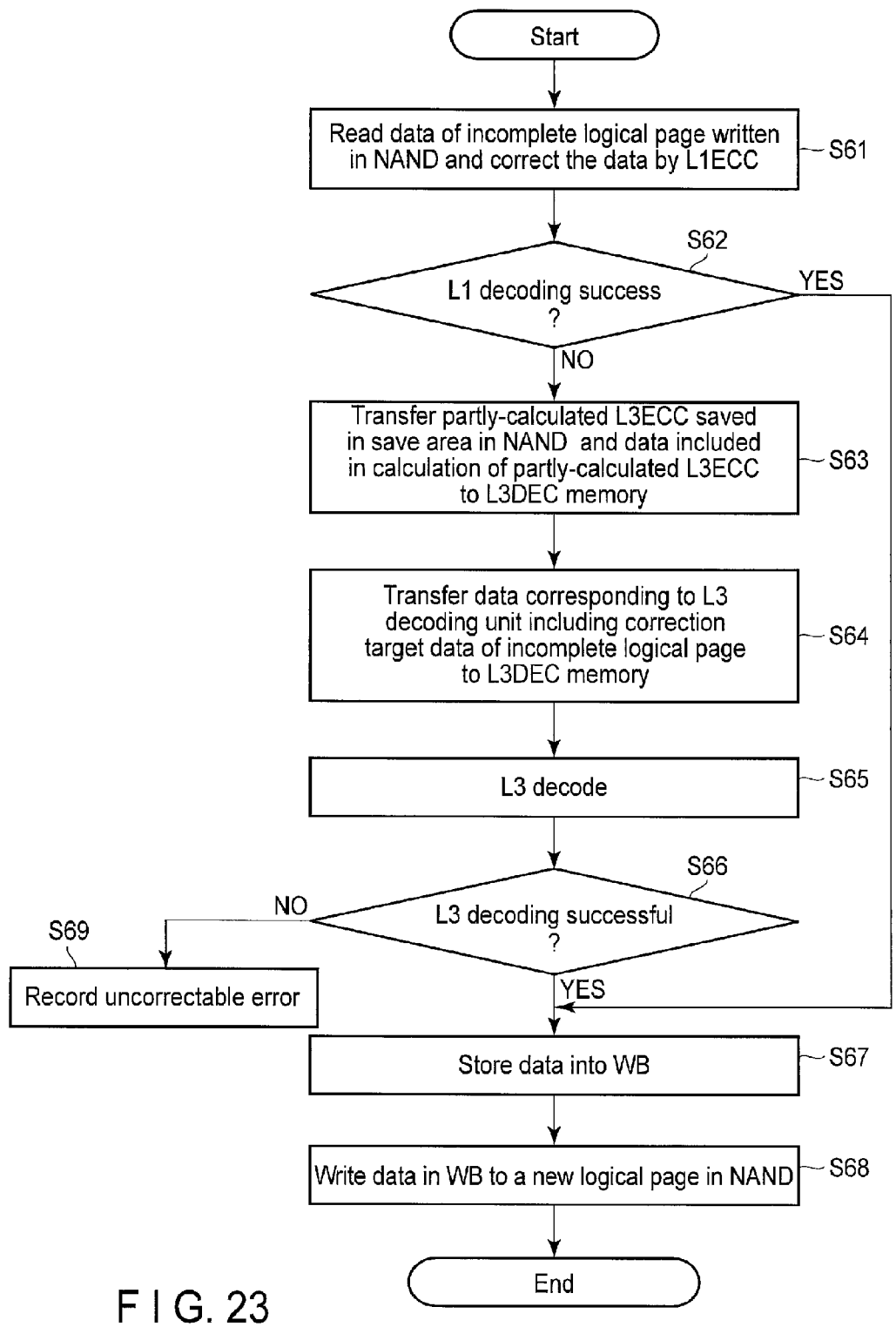
F I G. 23

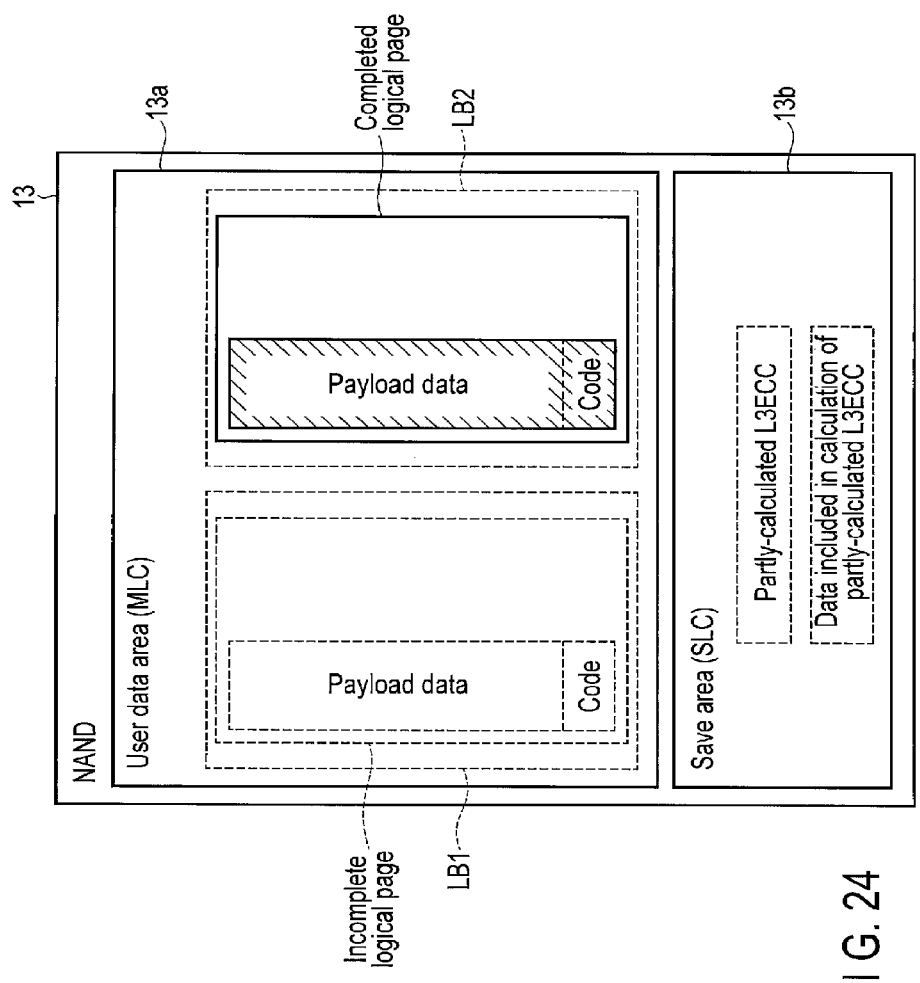
F I G. 24

MEMORY SYSTEM

CROSS-REFERENCE TO RELATED APPLICATIONS

This application claims the benefit of U.S. Provisional Application No. 62/215,560, filed Sep. 8, 2015, the entire contents of which are incorporated herein by reference.

FIELD

Embodiments described herein relate generally to a memory system applied to, for example, a solid-state drive (SSD).

BACKGROUND

An SSD comprises a buffer storing data in temporary which is transferred from a host and to be written to the NAND flash memory. The size of the buffer is required to be reduced.

BRIEF DESCRIPTION OF THE DRAWINGS

FIG. 2 is a configuration diagram schematically showing a configuration of a chip of the NAND flash memory shown in FIG. 1.

FIG. 5 schematically shows a structure of logical pages.

FIG. 14A, FIG. 14B and FIG. 14C are shown for explaining read access to a write buffer or a NAND depending on the cache status according to the first embodiment.

FIG. 15A and FIG. 15B are shown for schematically explaining a reading process of an L3ECC codeword in a second embodiment.

FIG. 16 is a flowchart schematically showing an L3ECC decoding process in the second embodiment.

FIG. 18 is a flowchart schematically showing an L3ECC decoding process in the third embodiment.

FIG. 20 is a flowchart schematically showing an L3ECC decoding process in the fourth embodiment.

FIG. 21 is a flowchart schematically showing an operation which is performed when a power source is turned off according to a fifth embodiment.

FIG. 23 is a flowchart schematically showing a decoding process and a refresh process after the power source is turned on according to the fifth embodiment.

FIG. 24 schematically shows a state of a nonvolatile memory after the power source is turned on.

DETAILED DESCRIPTION

Figure 1:
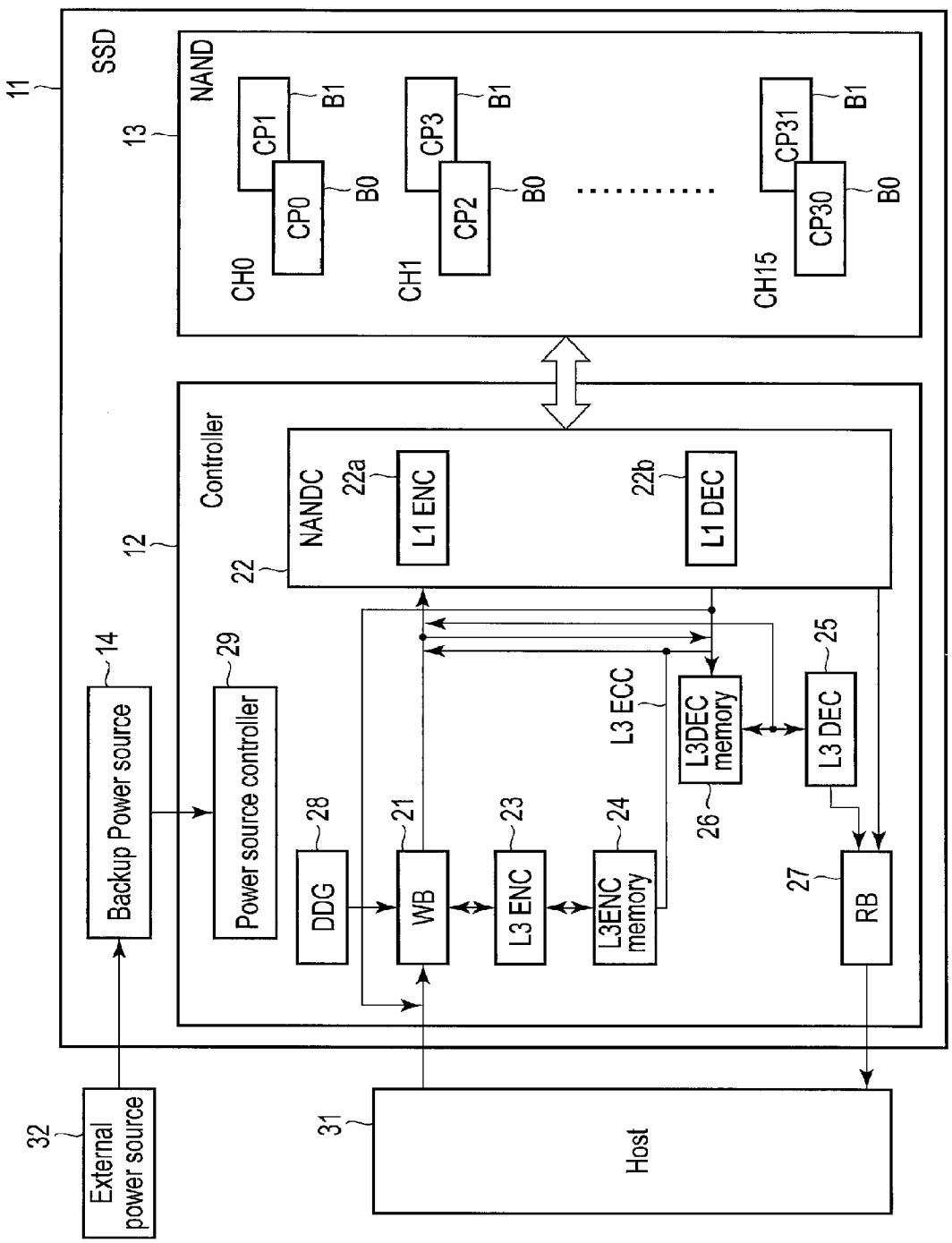
FIG. 1 is a configuration diagram schematically showing an SSD to which a first embodiment is applied.

In general, according to one embodiment, a memory system includes a first volatile memory, a nonvolatile memory and a controller. The first volatile memory stores data. The nonvolatile memory comprises a plurality of chips. The data stored in the first volatile memory are written to each of the chips for first data group. The first data group includes a first error correcting code for correcting an error in the data. The controller controls the first volatile memory and the nonvolatile memory. The controller generates a second error correcting code using the data stored in the first volatile memory, the second error correcting code being a code for correcting data which cannot be corrected included in the first data group using the first error correcting code, and releases an area of the first volatile memory corresponding to the first data group written in the nonvolatile memory, before completion of writing of all of the data which are stored in the first volatile memory and includes a codeword of the second error correcting code to the nonvolatile memory.

Embodiments will be described hereinafter with reference to the accompanying drawings. In the drawings, the same elements are denoted by the same reference numbers or symbols.

The write performance of an SSD is required to be improved. The write performance depends on the size of a write buffer which holds data to be written to the NAND flash memory. When the storage capacity of the write buffer is not sufficient, the write performance may be degraded. On the other hand, the capacity of the write buffer is required to be as small as possible for the purpose of reduction in power consumption or cost.

(Configuration of SSD)

FIG. 1 schematically shows a configuration of an SSD to which a first embodiment is applied. The SSD 11 includes an SSD controller (hereinafter, simply referred to as a controller) 12 which controls operations of the SSD, a NAND flash memory (a NAND) 13 and a backup power source 14.

The controller 12 includes a write buffer (WB) 21, a NAND controller (NANDC) 22 which controls operations of the NAND, a level 3 ECC encoder (L3ENC) 23, an L3ENC memory 24, a level 3 ECC decoder (L3DEC) 25, an L3DEC memory 26, a read buffer (RB) 27, a dummy data generator (DDG) 28 and a power source controller 29.

The WB 21 is composed of a volatile memory such as a static RAM (SRAM) or a dynamic RAM (DRAM). The WB 21 temporarily holds write data transferred from a host 31 or data read from the NAND 13. Specifically, the WB 21 also holds the target data for refresh or garbage collection (compaction) of the NAND 13.

The NANDC 22 controls, for example, writing, reading and erasing of the NAND 13 in accordance with various commands issued by the host 31. The NANDC 22 includes, for example, a level 1 ECC encoder (L1ENC) 22a and a level 1 ECC decoder (L1DEC) 22b.

As described later, the L1ENC 22a calculates an L1 error correcting code (L1ECC) based on data written to the NAND 13 and appends the L1ECC to write data. Thus, the L1ECC is used to correct an error in data within a single page. The L1ECC may be used to correct an error in data within a plurality of pages within a chip. The L1DEC 22b corrects the error in data based on the L1ECC which is read from the NAND 13 together with data.

For the L1ECC, for example, a Bose Chaudhuri Hocquenghem (BCH) code or a Low-Density Parity-Check (LDPC) code is employed. As an error detecting code, for example, a Cyclic Redundancy Check (CRC) code is appended to the data written to the NAND 13.

As described later, the L3ENC 23 generates an error correcting code between, for example, a plurality of pages (a plurality of chips) for purpose of recovering in case all the data included in a page of the NAND 13 or all the data included in a chip are lost. This error correcting code is called, for example, a level 3 ECC (L3ECC). Specifically, the L3ENC 23 generates an L3ECC based on the data stored in the WB 21 in order to correct the error which could not be corrected by the L1DEC 22b. An error which can not be corrected by L1DEC 22b is hereinafter referred to as an L1ECC error. For the L3ECC, for example, a Reed-Solomon (RS) code is used.

The L3ENC memory 24 is composed of a volatile memory such as an SRAM and temporarily stores an L3ECC for calculating by the L3ENC 23. The L3ECC includes a completely-calculated L3ECC and a partly-calculated L3ECC (incomplete L3ECC). An L3ECC and a partly-calculated L3ECC stored in the L3ENC memory 24 are written to the NAND 13 via the NANDC 22 as explained later.

The L3DEC memory 26 is composed of a volatile memory such as an SRAM and temporarily stores data for an L3ECC decoding unit including an L3ECC read from the NAND 13 via the NANDC 22, or the L3ECC read from the L3ENC memory 24. As described later, the L3ECC decoding unit is an L3ECC codeword with a width of two sectors, which is composed of an L3ECC code and corresponding data group as its payload. The L3DEC 25 corrects the error in data stored in the L3DEC memory 26 based on the L3ECC stored in the L3DEC memory 26.

The L1ENC 22a, the L1DEC 22b, the L3ENC 23 and the L3DEC 25 are not limited to hardware and may be realized as firmware included in the controller 12.

The RB 27 temporarily stores the data which is read from the NAND 13 and is corrected by the L1DEC 22b or the data corrected by the L3DEC 25. The data held by the RB 27 is transferred to the host 31.

The DDG 28 generates dummy data such as null data, that is, all "0". The dummy data may be data which does not change the code portion of the error correcting code as described later. The dummy data generated by the DDG 28 is supplied to, for example, the WB 21. The dummy data generated by the DDG 28 may be directly supplied to, for example, the L3DEC memory 26, the L3ENC 23 and the NANDC 22 as well as the WB 21. The DDG 28 may be omitted.

The backup power source 14 is composed of, for example, a capacitor, and is charged by an external power source (hereinafter, also referred to as a power source) 32. When the power source 32 is in an off-state, the backup power source 14 supplies power to the controller 12, the NAND 13, etc., for a certain period.

The power source controller 29 detects whether or not the power source 32 supplies power normally, specifically, whether the power source 32 is in an on-state or in an off-state. The power source controller 29 notifies the controller 12 of the result. When power is supplied from the power source 32, the power source controller 29 supplies power necessary to operate the controller 12, the NAND 13, etc., from the power source 32. When the power source 32 is turned off, the power source controller 29 switches the power supply from the power source 32 to the backup power source 14. Thus, after the power source 32 is turned off, power is supplied to the controller 12, the NAND 13, etc., from the backup power source 14 for a certain period.

The NAND 13 comprises a plurality of channels. Each of the channels comprises a plurality of banks. Specifically, the NAND 13 comprises, for example, sixteen channels CH0 to CH15. Each of the channels comprises, for example, two banks B0 and B1. For example, bank B0 of channel CH0 corresponds to a single chip (CP0). Bank B1 of channel CH0 corresponds to a single chip (CP1). Thus, the NAND 13 includes thirty two chips.

When a synchronous DRAM (SDRAM) is used for the WB 21 or the RB 27, the SDRAM may be provided outside the controller 12.

FIG. 2 schematically shows the configuration of a chip (CP0) shown in FIG. 1. The configurations of the other chips (CP1 to CP31) are the same as the configuration of chip CP0. Chip CP0 includes, for example, four planes PL0 to PL3. Each of planes PL0 to PL3 includes, for example, a memory cell array 41 and a peripheral circuit 43, etc. The peripheral circuit 43 includes a page buffer 42.

The memory cell array 41 includes a plurality of physical blocks 41a as the erase unit. Each physical block 41a includes a plurality of memory cells MC arranged in rows and columns. Each memory cell MC is connected to a word line WL. A NAND string including a plurality of memory cells is connected to a bit line BL and a source line SL.

The page buffer 42 holds the data to be written to the memory cell array 41 and the data read from the memory cell array 41. The page buffer 42 is capable of holding data for one page, approximately 16 KB (18 KB including a redundant portion).

The first embodiment employs a multiplane program. In the multiplane program, writing is applied to four planes PL0 to PL3 in chip CP0 simultaneously or parallelly. When data is transferred to the page buffer 42 of each of planes PL0 to PL3, the data of each page buffer 42 is written to the memory cell array 41 simultaneously or parallelly.

The NAND 13 includes sixteen channels CH0 to CH15 and two banks B0 and B1. Therefore, the multiplane program is executed in each channel and each bank.

The peripheral circuit 43 performs program verification, erase verification, etc. Program verification is performed to verify whether or not predetermined data has been written to the memory cells at the time of the application of the program to the memory cell array 41. Erase verification is performed to verify whether or not the data in the memory cells has been erased at the time of data erasure. For example, the results of program verification and erase verification are supplied to the NANDC 22 in accordance with a status read request supplied from the NANDC 22.

Figure 3:
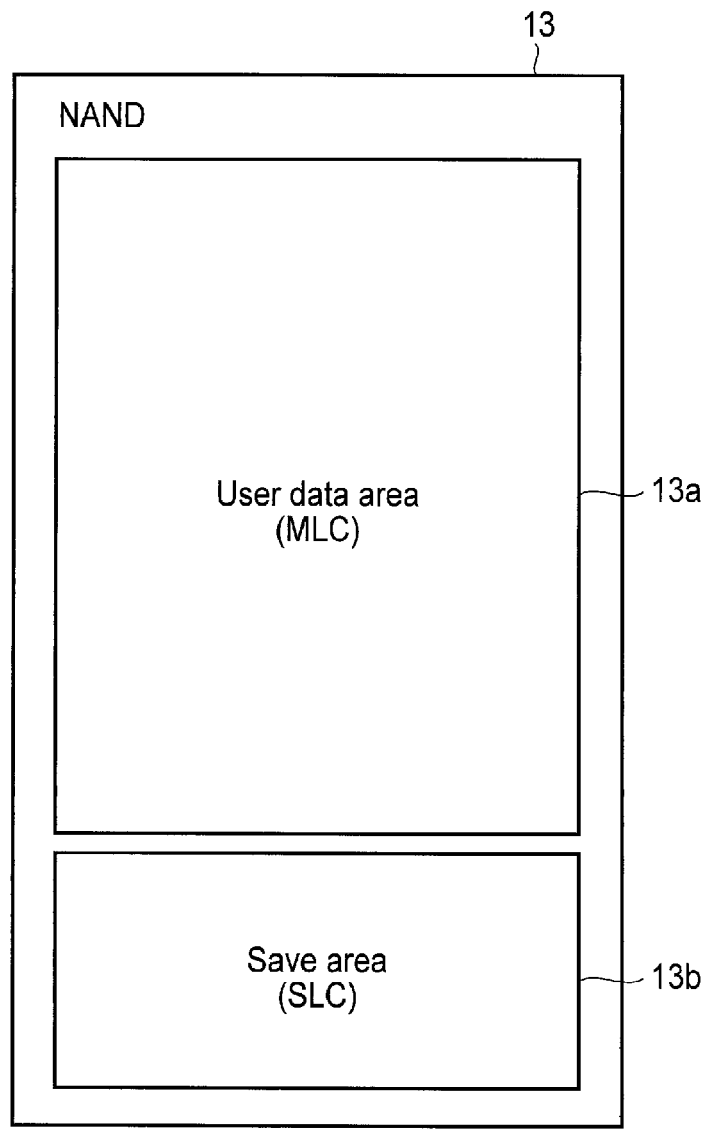
FIG. 3 schematically shows a storage area of the NAND flash memory shown in FIG. 1 based on the number of levels stored in a memory cell.

FIG. 3 schematically shows the storage area of the NAND 13. The NAND 13 includes, for example, a multi-level cell (MLC) area 13a and a single-level cell (SLC) area 13b. The MLC area 13a is composed of a cell which is allowed to store data of 2 bits or more in a single memory cell. The SLC area 13b is composed of a cell which stores data of 1 bit in a single memory cell. In the NAND, an MLC corresponds to 2 bits; a triple-level cell (TLC) corresponds to 3 bits; and a quadruple-level cell (QLC) corresponds to 4 bits. In the present embodiment, these cells are inclusively called an MLC. Blocks of NAND 13 are used as either SLC, MLC or TLC after block erase.

For example, user data is stored in the MLC area 13a. Thus, the MLC area 13a is also called a user data area 13a. The definition of user data is explained later. The SLC area 13b is an area for saving the data stored in the WB 21 and the data stored in the L3ENC memory 24 when the power source 32 of the SSD 11 is turned off. Thus, the SLC area 13b is also referred to as a save area 13b.

As described below, a plurality of logical pages are stored in the user data area 13a and the save area 13b. As explained below, the save area 13b is an area for storing, for example, a partly-calculated L3ECC or the data used to calculate an L3ECC on power off.

Each of the MLC area 13a and the SLC area 13b comprises a plurality of logical blocks as described later.

In FIG. 3, a management area is omitted. Management data necessary to operate the SSD 11 such as an address conversion table is stored in the management area. The user data area may be composed of SLC blocks as well as MLC blocks.

The user data area 13a and the save area 13b are appropriately allocated in, for example, bank 0 and bank 1 of channels CH0 to CH15 described above.

The save area 13b is provided as the SLC area 13b of the NAND 13. However, this structure is merely an example. The save area 13b may be composed of a nonvolatile memory different from the NAND 13, such as a magnetoresistive RAM (MRAM).

(General Operation of SSD 11)

As stated above, data writing to the NAND 13 employs the multiplane program. Thus, when a user data of an amount of four planes has been received into the WB 21, for example, data for sixteen clusters (64 KB), this data is transferred to the NAND 13 and is programmed to corresponding four planes.

Here is a description about the data writing operation to the NAND 13 in the SSD 11 shown in FIG. 1. The SSD 11 receives write commands issued by the host 31 and holds, in the WB 21, the data to be written. When the data for the write unit of the NAND 13 has been received into the WB 21, the NANDC 22 issues a write command to the NAND 13. When the data for the write unit has not been received yet in the WB 21, the NANDC 22 cannot issue a write command to the NAND 13 even if the NAND 13 is in a ready state. Thus, a useless waiting time is generated.

When the WB 21 is full, the WB 21 cannot receive write data from the host 31. Thus, a useless waiting time is generated in a host interface.

The L1ENC 22a of the NANDC 22 calculates the L1ECC for, for example, two sectors supplied from the WB 21. One sector is, for example, 512B. The calculated L1ECC is appended to the data of two sectors and is transferred to the page buffer 42 of each plane by a data-in operation.

After the page buffer 42 of each plane is filled with data by the data-in operation, the data in the page buffer 42 is written to the memory cell array 41 in accordance with a program command. After the program of the memory cell array 41 is completed, the controller 12 releases the area of the WB 21 in which the data for the write unit is held. If the release of the WB 21 is late, the use efficiency of the buffer is reduced. As described later, the controller 12 may release the area of the WB 21 after completion of the data-in, instead of after completion of the program.

The general operation of the WB 21 is as follows. When data is transferred from the host 31 to the SSD 11, the data is stored in the WB 21. When data for the write unit (sixteen clusters) is stored in the WB 21, the data is written to the NAND 13. After data writing to the NAND 13 is completed, the area in which the data written to the NAND 13 has been held is released.

(L3ECC)

As stated above, when the error in data cannot be corrected using an L1ECC, the SSD 11 corrects the error in data using an L3ECC.

Figure 4:
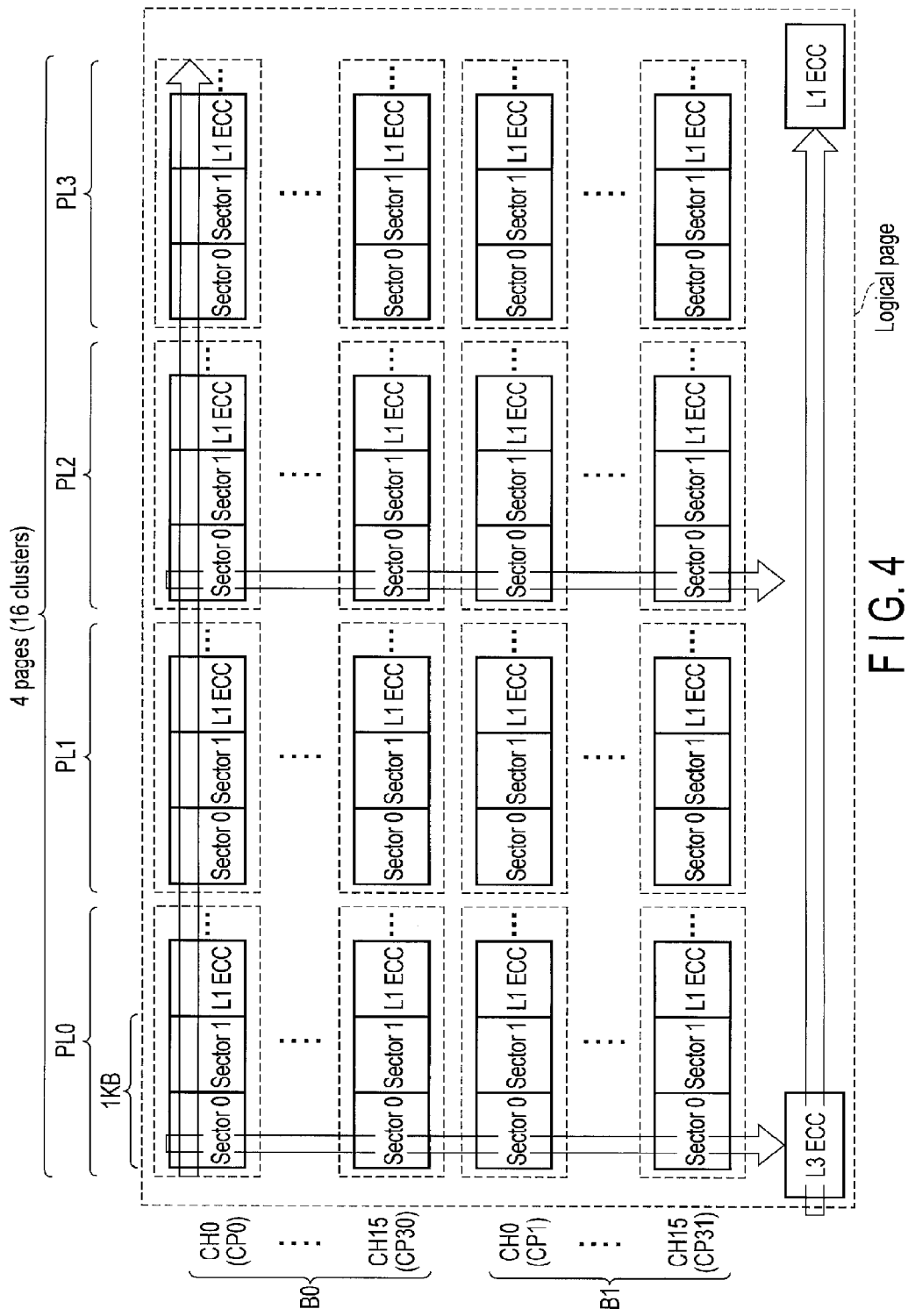
FIG. 4 schematically shows a relationship of allocations of two different kinds of error correction code applied to the first embodiment.

FIG. 4 shows the layout of L3ECC codewords in a logical page. As described above, the NAND 13 comprises, for example, sixteen channels (CH0 to CH15). Each of channels CH0 to CH15 comprises, for example, two banks (B0 and B1). Each bank of each channel is composed of, for example, one chip. Thus, the NAND 13 comprises thirty two chips (CP0 to CP31). Each of chips CP0 to CP31 includes, for example, four planes (PL0 to PL3).

The first embodiment is realized such that the L3ECC is enabled to correct the error when, for example, up to two symbols are lost out of sixty four symbols. Data can be recovered even if one chip is lost, by generating the L3ECC based on, for example, two data for each of thirty two chips. That is, for example, the L3ECC is calculated on the basis of data of the 62 pages in total, which are picked up by two pages in planes of PL0 and PL2 (or PL1 and PL3) in each chip. The calculated L3ECC is stored in the predetermined two pages of the predetermined two chips (one page per one chip) out of the thirty two chips.

FIG. 4 also shows the relationship between the L3ECC and the L1ECC. Each L1ECC is calculated for, for example, two sectors of each page and is appended to the data of the two sectors.

Each L3ECC is calculated for two planes, for example, for planes PL0 and PL2 or for planes PL1 and PL3. Specifically, for example, an L3ECC is generated by applying calculation to sixty two symbols included in a pair of two columns indicated by the vertical arrows of sixty two sectors 0 of planes PL0 and PL2. This processing is applied to all the data included in four pages.

That is, the L3ENC 23 calculates an L3ECC from 62 bits included in data corresponding to two planes (PL0 and PL2 or PL1 and PL3) of thirty two chips stored in the WB 21. The L3ECC calculated by the L3ENC 23 is held in the L3ENC memory 24. This processing is applied to all the data included in four pages. The L3ECC for two planes held in the L3ENC memory 24 is supplied to the NANDC 22.

The L1ENC 22a calculates each L1ECC, for example, for two sectors, in the L3ECC in two planes. The calculated L1ECC is written to a predetermined chip of the NAND 13 together with the L3ECC.

When a data read request is issued by the host 31, the controller 12 reads data from the NAND 13 via the NANDC 22. When an error is included in the data read from the NAND 13, the L1DEC 22b of the NANDC 22 corrects the error, using an L1ECC. When the error cannot be corrected by the L1DEC 22*b*, the data read from the NAND 13 is stored in, for example, the L3DEC memory 26.

The L3DEC 25 has, for example, an erasure correcting mode and a repetition correcting mode. In the erasure correcting mode, decoding is performed using only an L3ECC. In the repetition correcting mode, decoding is performed by repeatedly applying an L1ECC and an L3ECC. The repetition correcting mode requires the original data before L1ECC decoding which could not be corrected; however, the erasure correcting mode does not require the original data which could not be corrected. Thus, in the erasure correcting mode, there is no need to store the data read from the NAND 13 in the L3DEC memory 26.

When the L3DEC 25 is executed, data in which an L1ECC error occurred is stored in the L3DEC memory 26, bypassing the L1DEC 22*b*.

Subsequently, the NANDC 22 reads, from the NAND 13, data for the L3ECC decoding unit including an L3ECC corresponding to the correction target data stored in the L3DEC memory 26. The read data for the decoding unit is stored in the L3DEC memory 26. The L3DEC 25 corrects the correction target data based on the L3ECC stored in the L3DEC memory 26.

(Logical Page)

Data is written by the aforementioned multiplane program. The unit of the multiplane program is four pages (sixteen clusters)=64 KB for each channel in each bank as shown in FIG. 4. Each L3ECC is calculated for the data of 62 bits included in thirty two chips. The least common multiple between the unit of the multiplane program and an L3ECC is called a logical page. In short, one logical page is composed of approximately 2 MB (64 KB×32 chips).

FIG. 5 schematically shows the structure of a plurality of logical pages stored in a logical block of the user data area 13*a* of the NAND 13. A plurality of logical pages are stored in the user data area 13*a* or the save area 13*b* of the NAND 13. Each logical page includes data for the L3ECC decoding unit. Each data for the L3ECC decoding unit includes an L3ECC as a code. As described above, the L3ECC decoding unit is an L3ECC codeword with a width of two sectors, which is composed of an L3ECC code and corresponding data group as its payload. For example, the L3ECC decoding unit is 64 symbols×1 kB. Out of these 64 symbols, payload data corresponds to 62 symbols, and an L3ECC corresponds to 2 symbols.

A logical block is a virtual block composed of combining a plurality of physical blocks (not shown) as the erase unit included in a plurality of chips of the NAND 13. In the present embodiment, a logical block is the unit of collection of a plurality of physical blocks respectively included in four planes of each of chips CP0 to CP31 shown in FIG. 1, FIG. 2 and FIG. 4. Specifically, a logical block is composed of, for example, 32×4=128 physical blocks. A logical block includes a plurality of logical pages and is the least common multiple of the logical page and the physical block.

Figure 7:
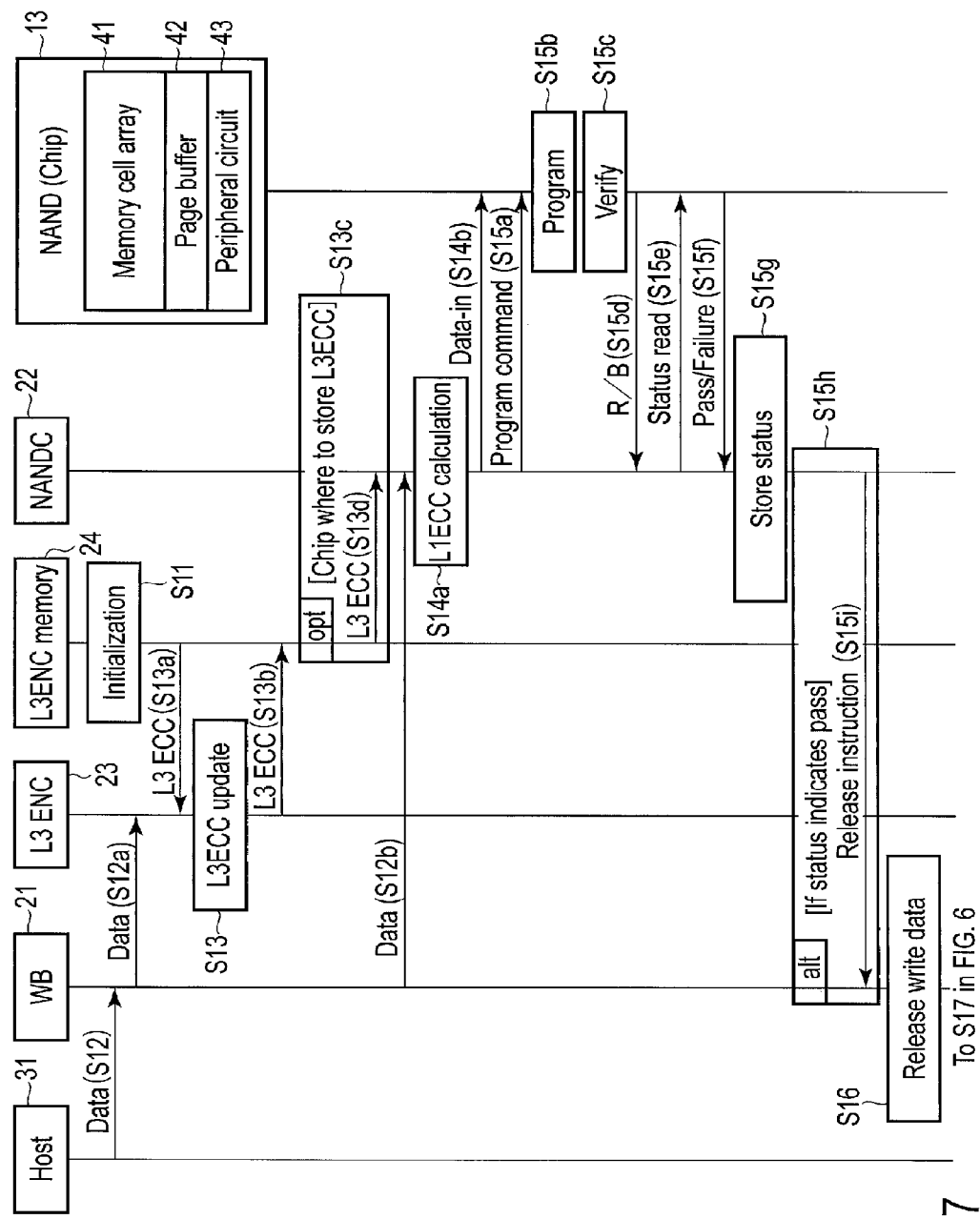
FIG. 7 is a sequence chart schematically showing the host writing process in the first embodiment.

When the above L3ECC is not employed, the WB 21 can be released in units of sixteen clusters (64 KB). When the L3ECC is employed, the release timing of the area in the WB 21 is after the completion of an L3 encoding and data writing corresponding to the entire user data (the definition of user data is described later) in a logical page. Here, "writing" means either of programming to the memory cell array 41 in the NAND 13 and data transmission (data-in) to the page buffer 42. The memory cell array 41 and the page buffer 42 are shown in FIG. 7, for example. In this case, the area of the WB 21 corresponding to user data for one logical page is occupied until the completion of L3 encoding corresponding to user data for one logical page and the completion of the program to the NAND 13 for one logical page or the completion of data-in for one logical page.

Process in the First Embodiment

In the first embodiment, after the data for the write unit for each chip of the NAND 13 is encoded by the L3ENC 23, and the data for the write unit is written to the NAND 13, the corresponding area of the WB 21 in which the data for the write unit is stored is released even if the writing to the NAND 13 for the logical page is not completed. In the present embodiment, the completion of writing of data for the write unit to the NAND 13 means the successful completion of the program.

In the modification example described below, the corresponding area for the write unit on the WB 21 is released after the completion of data-in in which the data for the write unit is transferred to the page buffer 42 of the NAND 13 and even before the completion of the program. Thus, the WB 21 may be released either after the completion of the program or after the completion of the data transfer to the page buffer 42 (data-in in short), depending on the implementation.

In the present embodiment and the modification example, the expression "written" may also indicate a state where data-in has been completed but the program has not been completed. The expression "completion of writing" includes "completion of the program" and "completion of the data-in", and hence the WB 21 is released after writing is completed according to this definition. According to this definition of "completion of writing", in the modification example, the completion of data writing to the NAND 13 means the completion of data-in, and it does not care about the completion/incompletion of the program.

Figure 6:
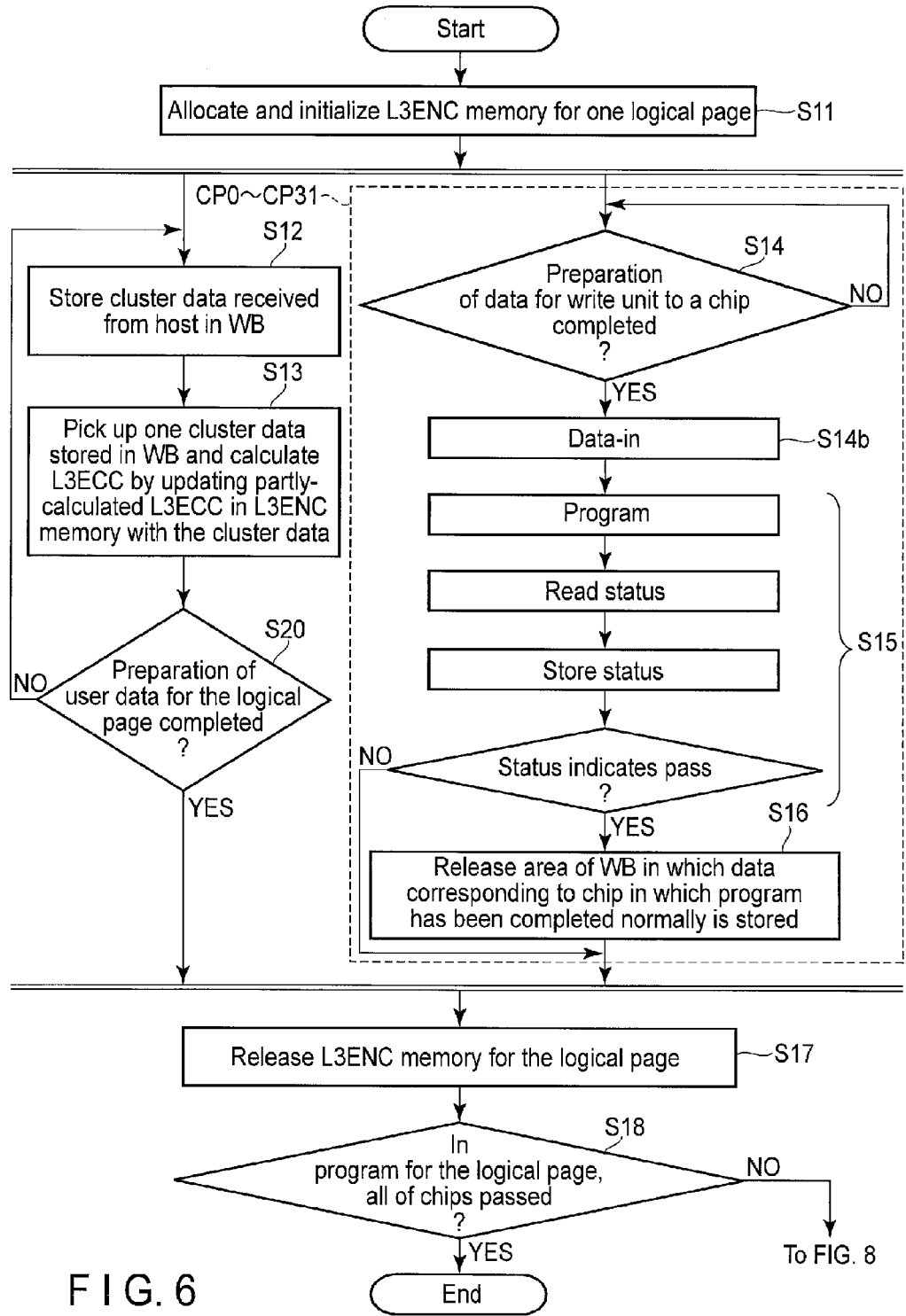
FIG. 6 is a flowchart schematically showing a host writing process in the first embodiment.

FIG. 6 and FIG. 7 schematically show the host writing process in the first embodiment. The flowchart shown in FIG. 6 schematically shows the processing for a plurality of chips CP0 to CP31 of the NAND 13. The sequence chart shown in FIG. 7 schematically shows the operation for each chip of the NAND 13. The relationship between the flowchart and the sequence chart in other figures is the same as that of FIG. 6 and FIG. 7. In the explanation below, write data transferred from the host 31 and data read from the NAND 13 excluding the L3ECC are also referred to as user data.

In FIG. 6, the operation indicated by steps S12, S13 and S20 is performed in parallel with the operation for each chip indicated by steps S14, S14*b*, S15 and S16.

The controller 12 allocates an area for an L3ECC for one logical page in the L3ENC memory 24 and initializes the area (S11). Subsequently, a logical block (not shown) as the destination of writing and a logical page included in the logical block as the destination of writing are allocated in the NAND 13.

For example, an area for sixteen clusters is allocated in the WB 21, corresponding to each chip of the NAND 13. While this area cannot be allocated, data transfer from the host 31 is blocked. When cluster data is transferred from the host 31, the data is stored in the area allocated in the WB 21 (S12).

Subsequently, out of the data stored in the WB 21, data for a cluster unprocessed by the L3ENC 23 is selected and processed by the L3ENC 23 (S13). The L3ENC 23 shown in FIG. 7 calculates data (S12*a*) for one cluster stored in the WB 21 and a partly-calculated L3ECC (S13*a*) held in the L3ENC memory 24 (S13). A partly-calculated (or incomplete) L3ECC of a logical page is an L3ECC calculated on the basis of part of the entire user data for the logical page, not all of them yet. In contrast, a complete L3ECC of a logical page is an L3ECC calculated on the basis of all of the user data for the logical page. The L3ECC of the L3ENC memory 24 is updated by the calculated L3ECC (S13b).

The above operation is repeatedly performed until the preparation of user data for one logical page is completed (NO in S20 in FIG. 6). The completion of preparation of user data for one logical page means that the L3ECC has been calculated for user data for the logical page.

In parallel with the above operation, determination is performed regarding whether or not the preparation of, in the WB 21, a data group to be written to each of chips CP0 to CP31 of the NAND 13 (hereinafter, referred to as data for the write unit) has been completed (S14).

"The completion of preparation of data for the write unit" means that data which is obtained from the host 31 and stored in the area of the WB 21 has reached the write unit (sixteen clusters) in a case of a chip where not to store an L3ECC. In a case of the rewriting process described later, the completion of preparation of data for the write unit means that data which is read from the NAND 13 and is stored in the area of the WB 21 has reached the write unit (sixteen clusters). In a case of a chip where to store an L3ECC, "the completion of preparation of data for the write unit" means that, for example, data for eight clusters has been prepared, and the calculation of the L3ECC corresponding to user data for one logical page has been completed. Data for eight clusters is data which is obtained from the host 31 and stored in the area of the WB 21, or data which is read from the NAND 13 and is stored in the area of the WB 21 in a case of the rewriting process described later.

To prevent memory starvation when the buffer size of the WB 21 is small, the allocation order of the buffer for the data received from the host 31 or the data read from the NAND 13 to the write unit of chips included in a logical page is statically determined in advance.

When the preparation of data for the write unit is not completed as a result of determination, a waiting operation is performed (NO in S14). When the preparation of data for the write unit is completed as a result of determination (YES in S14), data for the write unit in the WB 21 is transferred to the page buffer 42 of a corresponding chip of the NAND 13 (data-in) (S14b).

As data for the write unit of the NAND, as shown in S13c in FIG. 7, the L3ECC (S13d) held in the L3ENC memory 24 is considered as well as data (S12b) in the WB 21. In a case of the L3ECC (S13d), the data for eight clusters in the WB 21 and the L3ECC for eight clusters are transferred to the chip to which the data is written.

In the example explained below, data (S12b) for the write unit stored in the WB 21 is transferred to a chip of the NAND 13. After the completion of the program, an area of the WB 21 corresponding to the chip in which the program is successfully completed is released.

Specifically, as shown in FIG. 7, with regard to the data (S12b) for the write unit in the WB 21, the L1ECC is calculated by the L1ENC 22a of the NANDC 22 (S14a). Together with the L1ECC, the data is transferred to the page buffer 42 of a chip of the NAND 13 (S14b).

Subsequently, the data in the page buffer 42 of the NAND 13 is programmed to the memory cell array 41 (S15 in FIG. 6). When a program command is issued from the NANDC 22 to the NAND 13 (S15a), the data held in the page buffer 42 is programmed in the memory cell array 41 (S15b). Subsequently, the peripheral circuit 43 verifies whether or not the program has been successful (S15c).

Subsequently, for example, when the verification is completed, and a ready/busy (R/B) signal output from the NAND 13 is in a ready state (S15d), a status read request is issued from the NANDC 22 to the NAND 13 (S15e). The peripheral circuit 43 of the NAND 13 returns a status signal indicating pass or failure to the NANDC 22 in accordance with the status read request (S15f). The NANDC 22 memorizes the status signal supplied from each chip of the NAND 13 (S15g).

Subsequently, the NANDC 22 determines whether or not the status signal indicates pass (S15h). When the status signal indicates pass, the NANDC 22 instructs the WB 21 to release the area in which the data of the chip corresponding to the status signal is stored (S15i). In accordance with the instruction, the controller 12 releases the corresponding area in the WB 21 (S16). In S15h, in a case of a chip in which the status signal is determined as failure, the corresponding area in the WB 21 is not released. The data corresponding to the chip is maintained in the WB 21.

As shown in FIG. 6, after the above series of operations is performed for data for one logical page (YES in S20), and the above series of operations is performed for all of the chips included in one logical page (S14 to S16), the area for the L3ECC for one logical page in the L3ENC memory 24 is released (S17).

Subsequently, in S15g in FIG. 7, determination is performed regarding whether or not the program of all of the chips has been completed normally after the completion of the program to the NAND 13 for one logical page based on the status signal from each chip stored in the NANDC 22 (S18). When the program of all of the chips has been completed normally as a result of determination, the process is terminated (YES in S18). When the programming of one or more chips has been unsuccessful (NO in S18), user data for the logical page is rewritten.

In the first embodiment, data is released and not maintained in an area of the WB 21 which is successfully programmed in a chip. The area is an area in which data corresponding to a chip in which the program has been successful is stored. An area of the WB 21 in which data corresponding to a chip in which the program has been unsuccessful is stored is not released. Thus, the data is maintained in the WB 21. To rewrite user data for the logical page, it is necessary to read, from user data for the logical page written to the NAND 13, data of a chip in which the program has been successful, and store the data in the WB 21.

Figure 8:
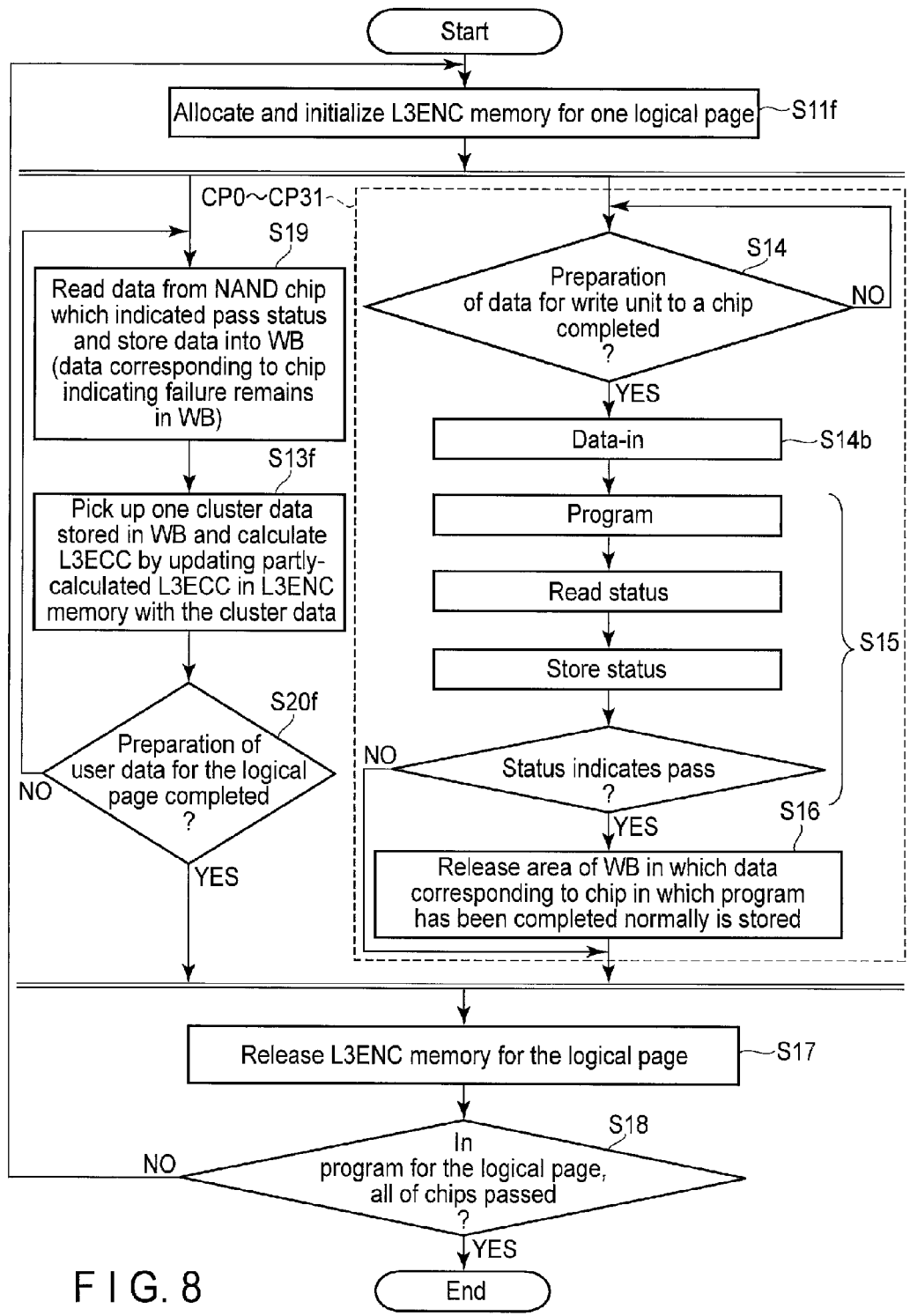
FIG. 8 is a flowchart schematically showing a rewriting process subsequent to FIG. 6.
Figure 9:
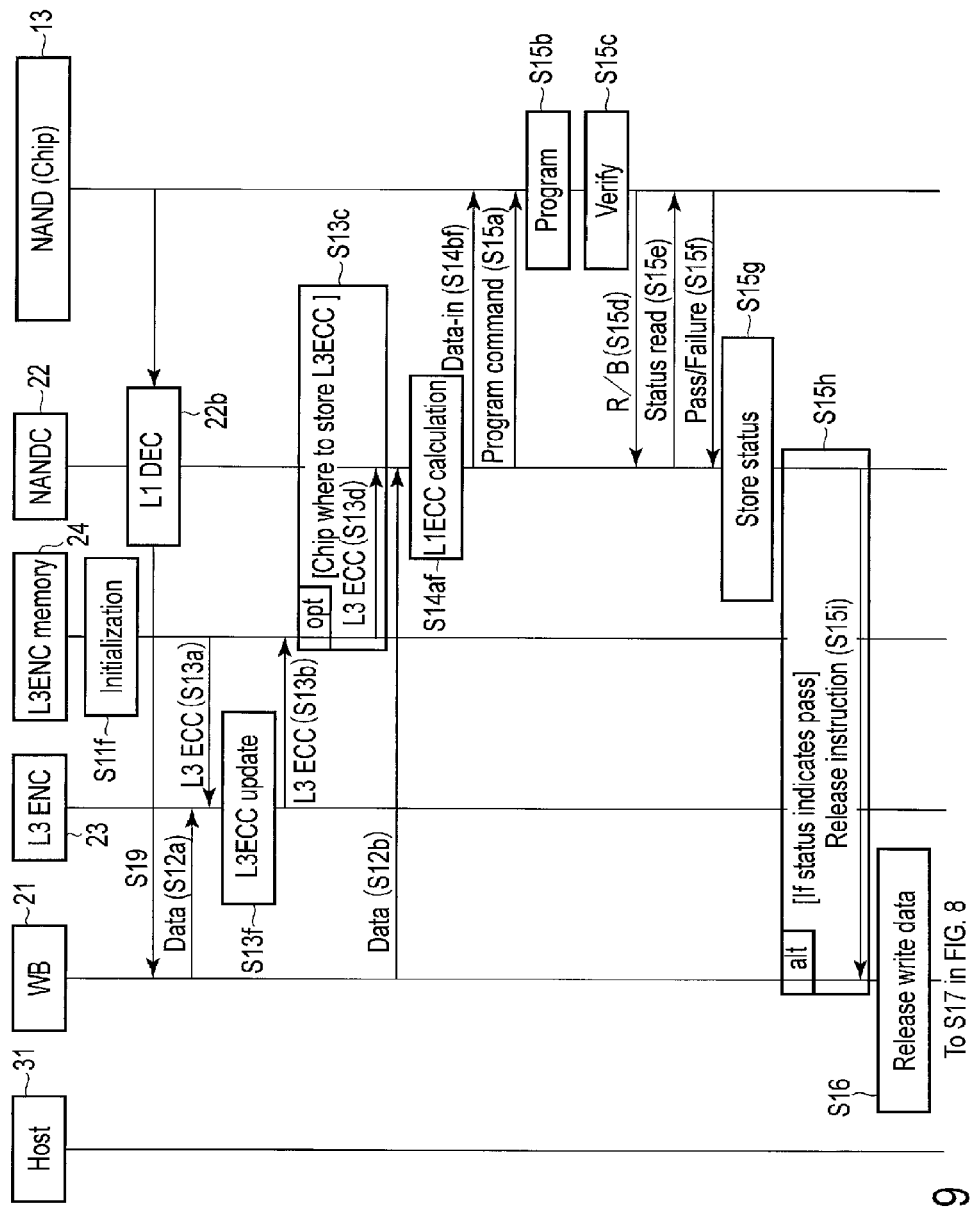
FIG. 9 is a sequence chart schematically showing the rewriting process subsequent to FIG. 7.

FIG. 8 and FIG. 9 schematically show a process for rewriting data. An L3ECC area for one logical page is allocated in the L3ECC memory 24 and is initialized (S11f). Subsequently, a new logical block different from the current logical block is allocated in the NAND 13. Thus, a logical page is allocated in the new logical block as the new destination of writing.

To store, in the WB 21, data read from a chip of the NAND 13, an area corresponding to the chip is allocated in the WB 21. When the area cannot be allocated, data transfer from the chip to the WB 21 is blocked. Subsequently, data unprocessed by the L3ENC 23 is read from a chip of the NAND 13 in which the program has been completed normally, and is stored in the area allocated in the WB 21 (S19).

Specifically, as shown in FIG. 9, data for the write unit read from a chip of the NAND 13 in which the program has been completed normally is decoded by the L1DEC 22b. Subsequently, the decoded data is stored in the area allocated in the WB 21 (S19). If an error which cannot be corrected by the L1DEC 22b, referred to as L1ECC error, which cannot be corrected by the L1DEC 22b occurred, the data is recovered by the L3DEC 25 described later and is stored in the WE 21.

Subsequently, as shown in S13f of FIG. 8, one unprocessed cluster is selected and processed (S13f). The L3ENC 23 in FIG. 9 calculates and updates the partly-calculated L3ECC in the L3ENC memory 24 (S13b) on the basis of the current partly-calculated L3ECC held in L3ENC memory 24 (S13a) and the selected cluster data (S12a).

The above operation is repeatedly performed for the data in the WB 21 until the completion of preparation of user data for one logical page (NO in S20f in FIG. 8).

In parallel with the above operation, determination is performed regarding whether or not the preparation of, in the WB 21, data for the write unit (sixteen clusters) to be written to each of chips CP0 to CP31 of the NAND 13 has been completed (S14 in FIG. 8). As a result of determination, when the preparation of data for the write unit has not been completed, a waiting operation is performed (NO in S14). When data for the write unit is stored in the WB 21, and the L3ECC has been already calculated for the data (YES in S14), the data for the write unit in the WB 21 is transferred to the page buffer 42 of a corresponding chip of the NAND 13 (data-in) (S14b).

Subsequently, the data for which writing was successful and the data for which writing was unsuccessful in the previous program are rewritten to the memory cell array 41 of a chip (S15). Specifically, the operation of steps S15a to S15g in FIG. 9 is performed. Thus, the data is rewritten to the memory cell array 41 of the chip. Subsequently, the status signal is determined (S15h). When the status signal indicates that the program has been successful, a release instruction is supplied to the WB 21 (S15i). Thus, an area of the WB 21 in which data for the write unit corresponding to a chip in which the program has been successful is stored is released (S16). This process is same as the operation explained with reference to FIG. 6 and FIG. 7.

Subsequently, as shown in FIG. 8, when the above series of operations is performed for user data for the logical page (YES in S20f), and further, the above series of operations is performed for all of the chips included in the logical page (S14 to S16), an area for the L3ECC for the logical page in the L3ENC memory 24 is released (S17).

Subsequently, in S15g in FIG. 9, determination is performed regarding whether or not the program of all of the chips has been completed normally after the completion of the program to the NAND 13 for the logical page based on the status signal from each chip of the NAND 13 stored in the NANDC 22 (S18). As a result of determination, when the program of all of the chips has been completed normally, the process is terminated (YES in S18). When the programming of even one or more chips has been unsuccessful (NO in S18), a new logical block and a new logical page are allocated in the NAND 13. User data for the logical page is rewritten again (S11f).

In the above explanation, after the calculation of the L3ECC, the data stored in the WB 21 is written to the NAND 13. However, the operation is not limited to this example. The L3ECC may be calculated after the completion of transfer of data stored in the WB 21 to the page buffer 42 of the NAND 13 (in other words, after the completion of data-in).

According to the first embodiment, a data in the WB 21 for a write unit of NAND 13 is written to a chip of the NAND 13 after calculating L3ECC for the entire data for the write unit. After calculating L3ECC by the L3ENC and the completion of writing, an area of the WB 21 in which data for the write unit corresponding to the chip is stored is released. In the first embodiment, when the L3ECC is used, an area of the WB 21 can be released based on a unit smaller than the size of user data for one logical page. Thus, even when the L3ECC is employed, it is possible to prevent from occupying the area of the WB 21 for a long period. Thus, the turnover rate of the WB 21 can be improved.

Modification Example

In the first embodiment, the NANDC 22 waits for the completion of the program of each chip of the NAND 13 to release the corresponding area of WB 21. When a status signal supplied from a chip of the NAND 13 indicates that the program has been successful, an area of the WB 21 corresponding to the chip in which the program has been successful is released. In the present modification example, at the time of the completion of data-in in which data for the write unit is transferred to a chip of the NAND 13, an area of the WB 21 corresponding to the chip in which data-in has been completed can be released without waiting for the completion of the program. Since it takes several milliseconds for the program, the turnover rate of the WB 21 can be further improved by releasing an area of the WB 21 without waiting for the completion of the program.

FIG. 10, FIG. 11, FIG. 12 and FIG. 13 show the modification example of the first embodiment.

Figure 10:
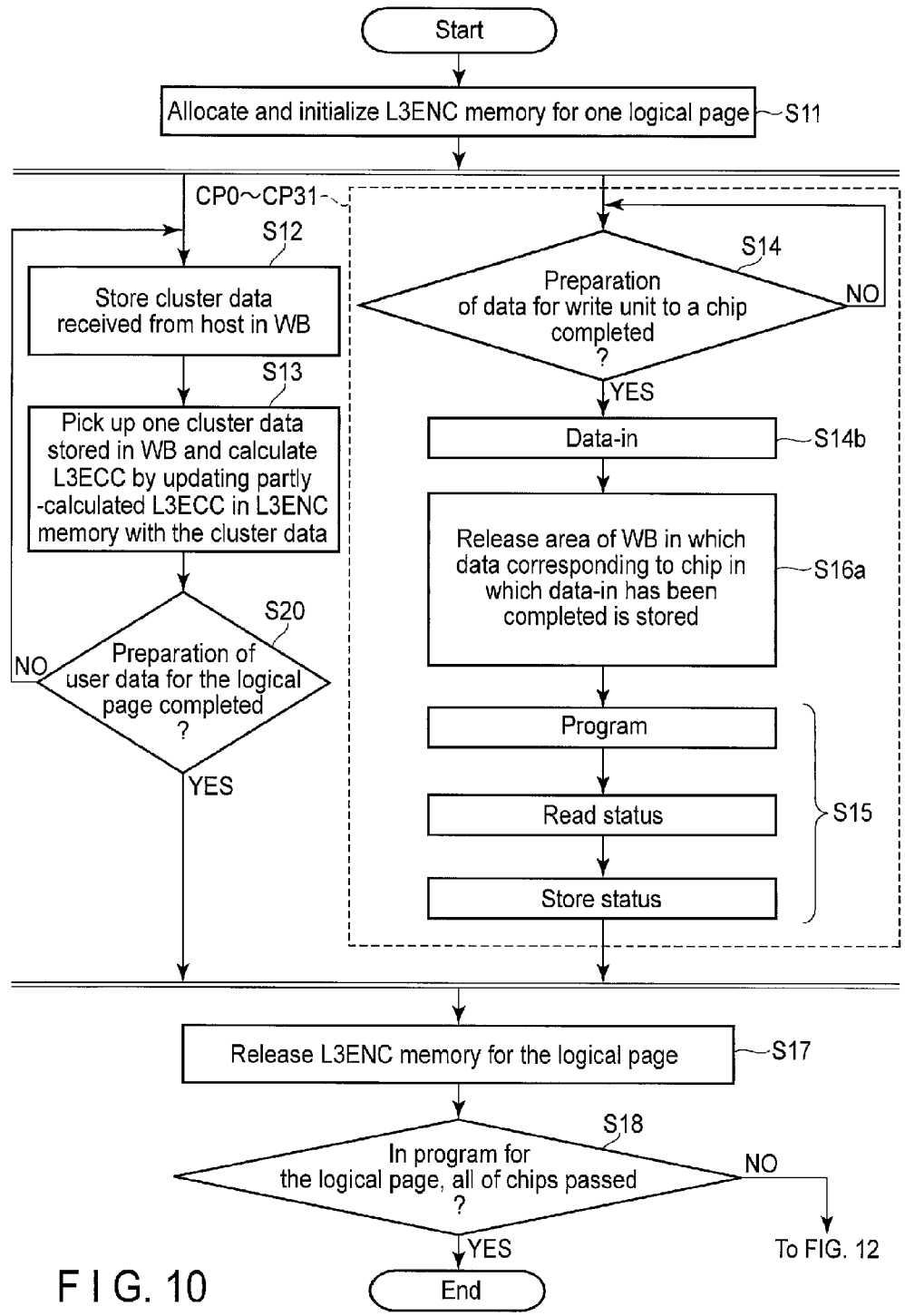
FIG. 10 is a flowchart schematically showing a host writing process in a modification example of the first embodiment.
Figure 11:
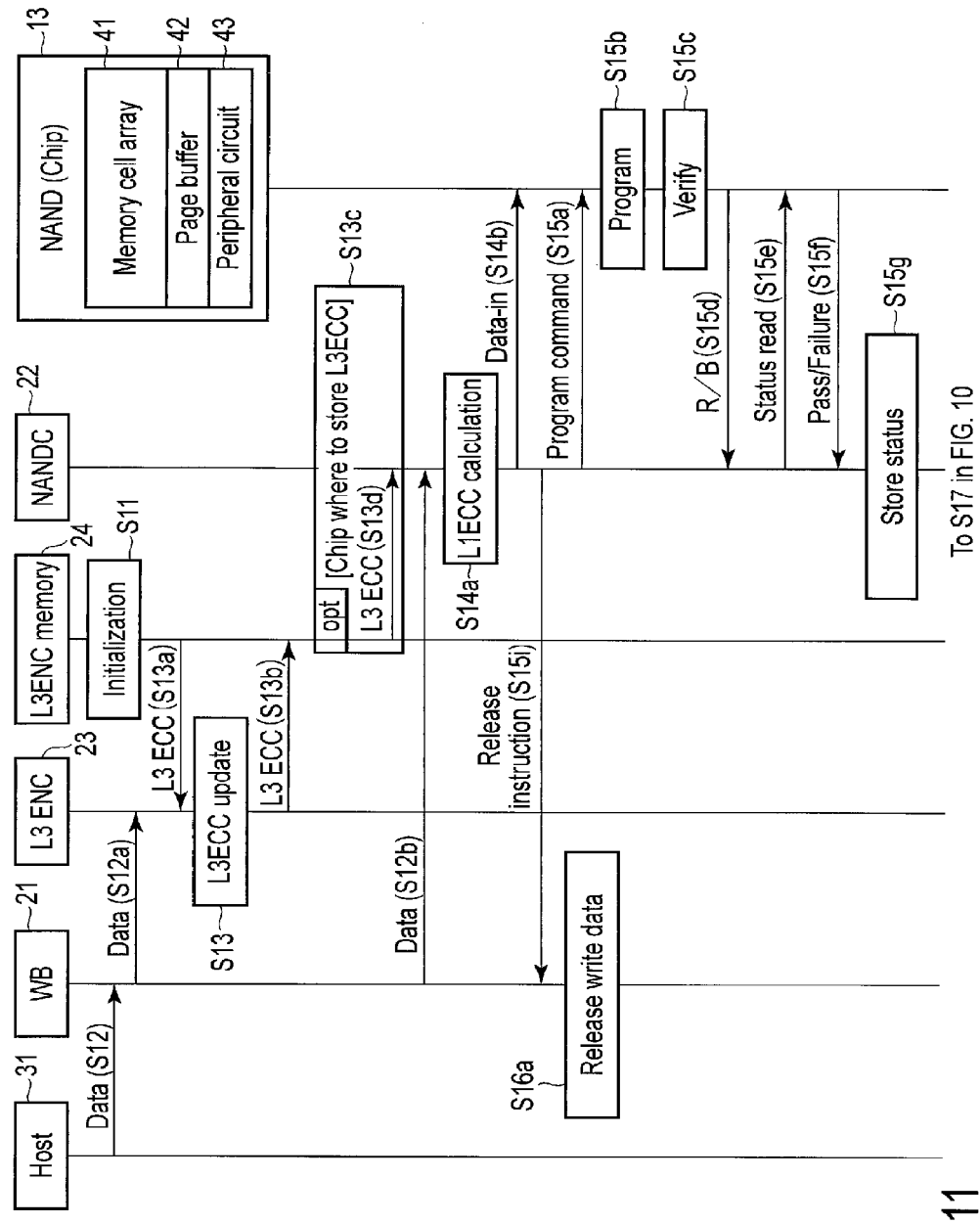
FIG. 11 is a sequence chart schematically showing the host writing process in the modification example of the first embodiment.

In FIG. 10 and FIG. 11, the operation of steps S11 to S14b is same as that of the first embodiment. Therefore, the operation is only briefly explained. The area for the L3ECC for one logical page is allocated in the L3ENC memory 24 and is initialized (S11). Subsequently, a logical block as the destination of writing, and a logical page included in the logical block as the destination of writing are allocated in the NAND 13.

For example, the area for sixteen clusters is allocated in the WB 21, corresponding to each chip of the NAND 13. While this area cannot be allocated, data transfer from the host 31 is blocked. The data received from the host 31 is stored in the area allocated in the WB 21 (S12).

The L3ECC is calculated for data unprocessed by the L3ENC 23 stored in the WB 21. The L3ECC in the L3ENC memory 24 is replaced with the calculated L3ECC (S13). This operation is repeatedly executed until the preparation of the data in the WB 21 for the entire user data for one logical page is completed (NO in S20).

In parallel with the above operation, determination is performed regarding whether or not the preparation of, in the WB 21, data for the write unit (sixteen clusters) to be written to each of chips CP0 to CP31 of the NAND 13 has been completed (S14). As a result of determination, when the preparation of data for the write unit has not been completed, a waiting operation is performed (NO in S14). When data for the write unit is stored in the WB 21, and the L3ECC has been already calculated for the data (YES in S14), the data for the write unit in the WB 21 is transferred to a chip of the NAND 13 (data-in) (S14b).

As shown in FIG. 10, in the present modification example, data for the write unit is transferred from the WB 21 to a chip of the NAND 13 (data-in) (S14b). At the time of completion of transfer, an area of the WB 21 in which data corresponding to the chip in which transfer has been completed is stored is released (S16a). In the present modification example, the area of the WB 21 is released without waiting for the supply of the status signal indicating whether or not the program has been successful from the NAND 13 to the NANDC 22.

Specifically, in S14b shown in FIG. 11, if data-in to the page buffer 42 of the NAND 13 (S14b) has been completed, a release instruction is supplied from the NANDC 22 to the WB 21 (S15i). Accordingly, the controller 12 releases the area of the WB 21 corresponding to the chip of the NAND 13 in which data-in has been completed (S16a).

Subsequently, in a manner similar to that of the first embodiment, a program command is supplied from the NANDC 22 to the chip of the NAND 13 (S15a). The operation related to the program of the NAND 13 is performed (S15b to S15f). A status signal which is supplied from the chip and indicates whether or not the program has been successful is memorized in the NANDC 22 (S15g).

Subsequently, as shown in FIG. 10, when the above series of operations is performed for user data for the logical page (YES in S20), and further, the program has been completed for all of the chips included in the logical page (S15), the area of the L3ENC memory 24 for the L3ECC for the logical page is released (S17).

Subsequently, in S15g in FIG. 11, determination is performed regarding whether or not the program of all of the chips has been completed normally after the completion of the program of the NAND 13 for the logical page based on the status signal from each chip stored in the NANDC 22 (S18). As a result of determination, when the program of all of the chips has been completed normally, the process is terminated (YES in S18). When the programming of one or more chips has been unsuccessful (NO in S18), user data for the logical page is rewritten.

In the present modification example, the area of the WB 21 in which data corresponding to each chip is stored is released before the completion of the program to each chip. Thus, to rewrite user data for the logical page, it is necessary to read, from the NAND 13, user data for the logical page written to the NAND 13, and store the data in the WB 21.

Figure 12:
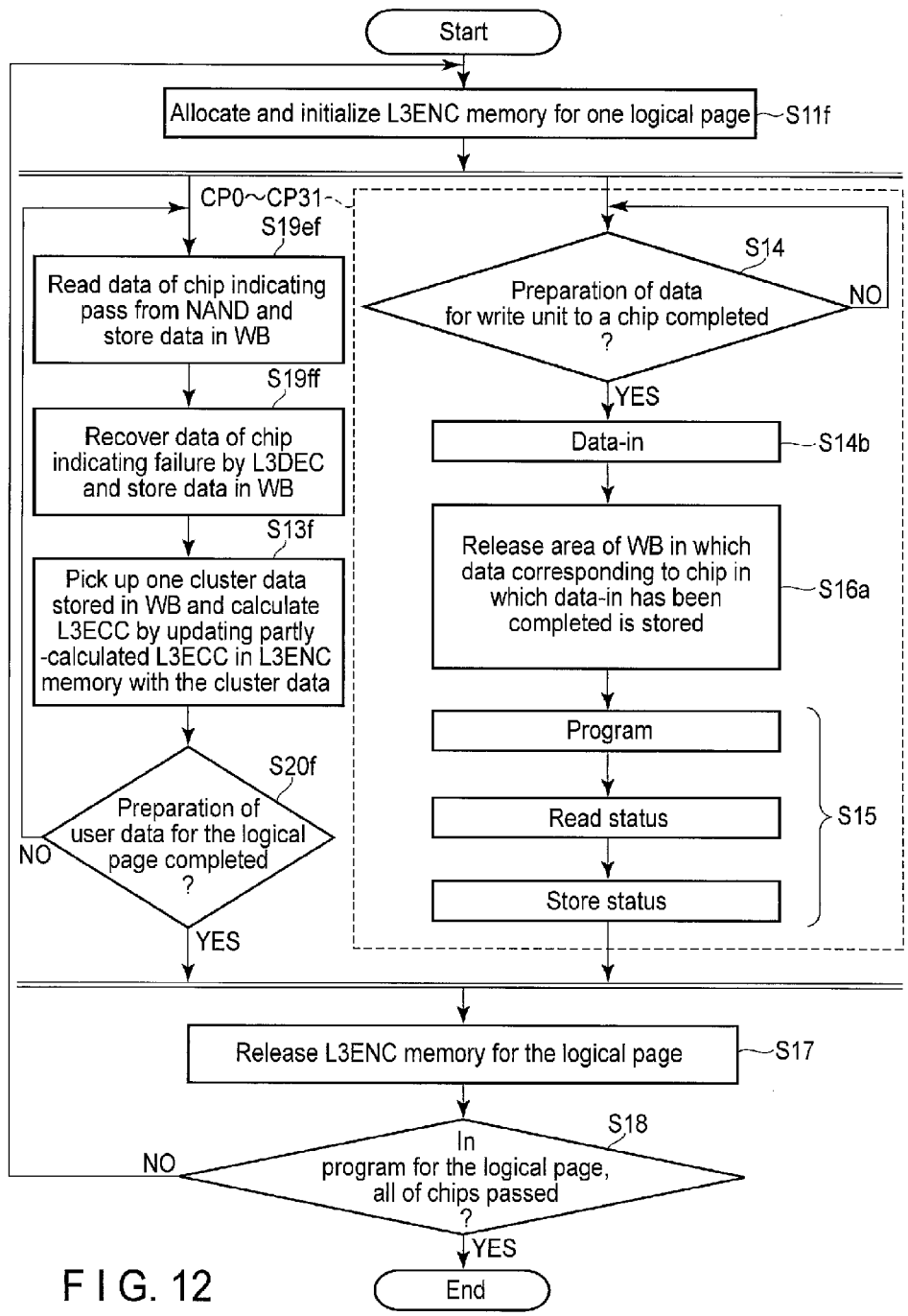
FIG. 12 is a flowchart schematically showing a rewriting process subsequent to FIG. 10.
Figure 13:
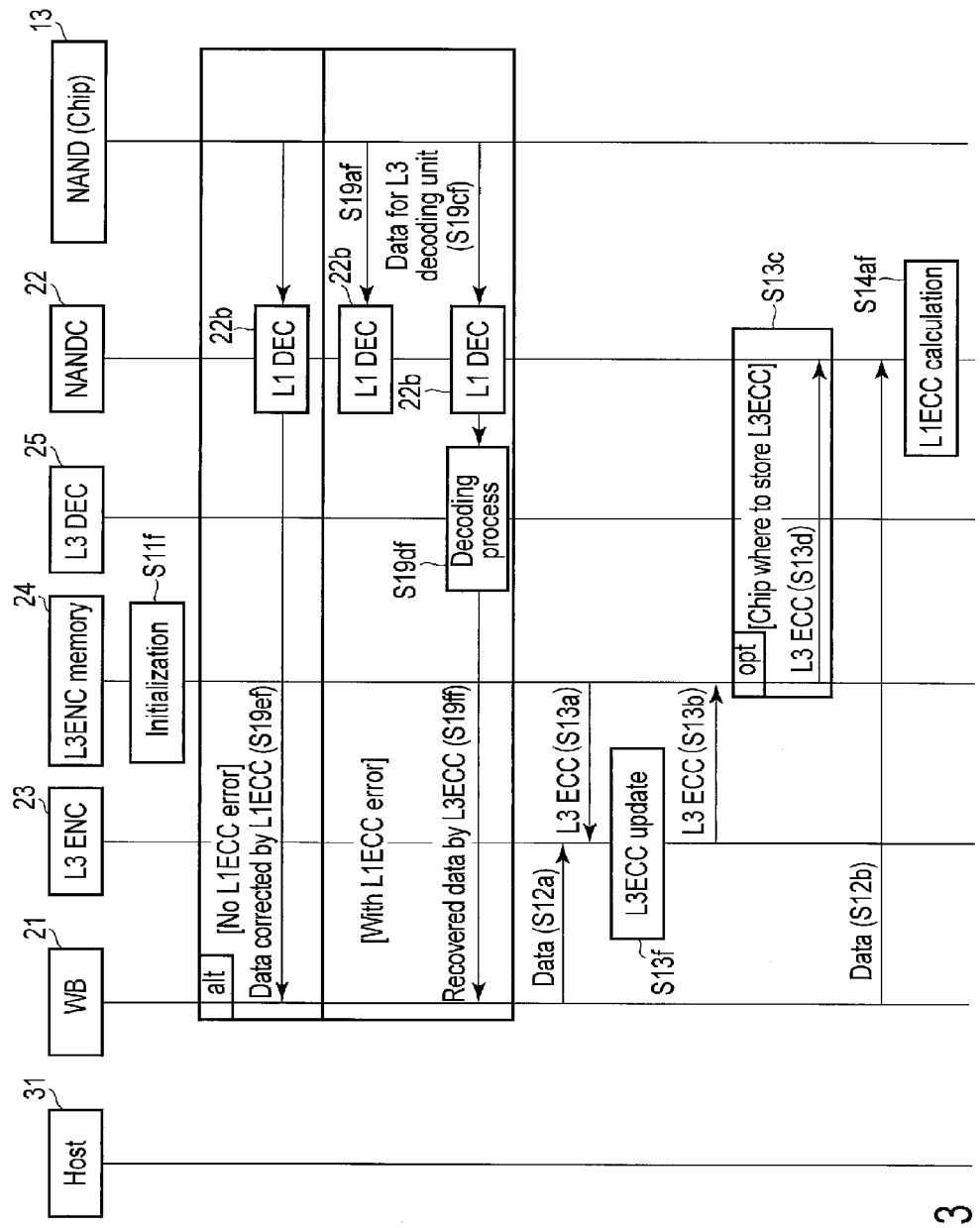
FIG. 13 is a sequence chart schematically showing the rewriting process subsequent to FIG. 11.

FIG. 12 and FIG. 13 schematically show the rewriting process in the present modification example. As shown in FIG. 12, the area for the L3ECC for one logical page is allocated in the L3ECC memory 24 and is initialized (S11f). Subsequently, a new logical block different from the current logical block is allocated in the NAND 13. A logical page is allocated in the new logical block as the new destination of writing.

To store, in the WB 21, the data read from each chip of the NAND 13, an area is allocated in the WB 21, corresponding to each chip of the NAND 13. When the area cannot be allocated, data transfer from the chip to the WB 21 is blocked. Subsequently, for example, data unprocessed by the L3ENC 23 for the write unit is read from each chip of the NAND 13 and is decoded by the L1DEC 22b. At this time, data in which the program has been successful has a low possibility that an L1ECC error occurs. An L1ECC error indicates that the error could not be corrected with the L1ECC. The data decoded by the L1DEC 22b normally is stored in the WB 21 (S19ef).

The data (S19af) shown in FIG. 13 is, out of data unprocessed by the L3ENC 23 read from the chip of the NAND 13, data in which the program has been unsuccessful. When the data (S19af) is decoded by the L1DEC 22b, an L1ECC error may occur. When an L1ECC error has occurred, data which could not be corrected by the L1ECC is recovered with the L3ECC.

In this case, the area of the L3DEC memory 26 for the L3ECC decoding unit (shown in FIG. 1) is initialized by the controller 12. The area for the L3ECC decoding unit refers to an area configured to store an L3ECC code and corresponding data group as its payload, which compose an L3ECC codeword, for example, an area of (62 symbols+ L3ECC)×1 kB. Subsequently, data for the L3ECC decoding unit (S19cf) is read from the NAND 13 on the basis of, for example, two sectors. The data for the L3ECC decoding unit is decoded by the L1DEC 22b and is stored in the L3DEC memory 26. The data for the L3ECC decoding unit stored in the L3DEC memory 26 is decoded by the L3DEC 25, using the L3ECC (S19df). Through the decoding using the L3ECC, the data lost in the L1DEC 22b is recovered, and data in which the program has been unsuccessful is recovered (S19ff). The recovered data (S19ff) is stored in the WB 21.

Subsequently, as shown in FIG. 12, out of the data stored in the WB 21, data unprocessed by the L3ENC 23 for a cluster is selected and processed by the L3ENC 23 (S13f). In other words, the L3ENC 23 shown in FIG. 13 calculates L3ECC for data for one cluster stored in the WB 21 (S12a) and a partly-calculated L3ECC held by the L3ENC memory 24 (S13a) (S13). The L3ECC of the L3ENC memory 24 is replaced with the calculated L3ECC (S13b).

This operation is repeatedly performed for the data in the WB 21 until the completion of preparation of user data for the logical page (NO in S20f in FIG. 12).

In parallel with the above operation, determination is performed regarding whether or not the preparation of, in the WB 21, data for the write unit (sixteen clusters) to be written to each of chips CP0 to CP31 of the NAND 13 has been completed (S14). As a result of determination, when the preparation of data for the write unit has not been completed, a waiting operation is performed (NO in S14). When data for the write unit is stored in the WB 21, and the L3ECC is calculated for the data (YES in S14), data for the write unit in the WB 21 is transferred to a corresponding chip in a logical page included in a newly allocated logical block in the NAND 13 (data-in) (S14b).

As shown in FIG. 12, data for the write unit is transferred from the WB 21 to a chip of the NAND 13 (S14b). At the time of completion of transfer, the area of the WB 21 in which data corresponding to the chip in which transfer has been completed is stored is released (S16a).

In FIG. 13, the operation after S14af is omitted. After S14af, the program process similar to that of FIG. 11 is performed (S15). Specifically, a program command is supplied from the NANDC 22 to a chip of the NAND 13 (S15a). The operation related to the program of the NAND 13 is performed (S15b to S15f). A status signal indicating whether or not the program for each chip has been successful is stored in the NANDC 22 (S15g).

Subsequently, as shown in FIG. 12, when the above series of operations has been performed for user data for the logical page (YES in S20f), and further, when the program has been completed for all of the chips included in the logical page (S15), the area of the L3ENC memory 24 for the L3ECC for the logical page is released (S17).

Subsequently, determination is performed regarding whether or not the program of all of the chips has been completed normally after the completion of the program to the NAND 13 for the logical page based on the status signal from each chip stored in the NANDC 22 (S18). As a result of determination, when the program of all of the chips has been completed normally, the process is terminated (YES in S18). When the programming to one or more chips has not been completed normally (NO in S18), the control is moved to S11f, and user data fox the logical page is rewritten.

When the program has been unsuccessful, the NANDC 22 recognizes the place in which the program has been unsuccessful. Therefore, the flow for reading data from the NAND 13 and generating an L1ECC error may be omitted.

The program operation to the NAND 13 is not always successfully performed, and results in failure in some cases. When the program operation has been unsuccessful, the data in the memory cell of the writing target is lost, and in addition, the data to another memory cell may also be lost. For example, the following three situations are considered as this case.

(1) For example, the MLC area 13a shown in FIG. 3 is assumed to store data of 2 bits in one memory cell. After the data to the lower page has been programmed, and subsequently, the program operation of the data of the upper page selected by the same word line as the lower page selected by results in failure, the data of the lower page is lost induced by the failure.

(2) In the memory cell array of a plane shown in FIG. 2, adjacent two word lines are assumed to be in a short-circuit state, or short-circuiting is assumed to occur. In this case, if the program operation of the memory cell connected with one of the two word lines results in failure, the data written to the memory cell connected with the other word line is lost in connection with the failure.

(3) In FIG. 2, one chip is assumed to include a plurality of planes which can be programmed at the same time. In this case, if the program operation of one plane results in failure, the program of another plane in the chip may result in failure collaterally. Thus, the data in another plane is lost.

The data which is lost in the above situations can be also recovered with the L3ECC in the above manner.

For example, in situations (1) and (2), as well as the user data and the L3ECC of the logical page in which writing has been unsuccessful, the user data and the L3ECC of the adjacent logical page are also lost. In either the first embodiment or the modification example, the data which is lost collaterally can be recovered by applying the rewriting operation (through data recovered by the L3DEC) shown in the modification example.

Second Embodiment

In the first embodiment, when the L3ECC is used, the release unit of the WB 21 is less than the size of user data for one logical page. In this case, the data in the WB 21 includes data already written to the NAND 13 and data which is not written to the NAND 13 yet. Further, an area in the WB 21 corresponding to data written to the NAND 13 may have been released or may not have been released. Under the circumstances, when a read request is issued from the host 31, the following situations will arise.

As shown in FIG. 14A, data is assumed to remain in the WB 21 after the transmission of the data from the WB 21 to the NAND 13. In this situation, when a read access is issued for a logical address (LBA) corresponding to the data in the WB 21, data corresponding to the LBA is not read from the NAND 13, but read from the WB 21.

As shown in FIG. 14B, the WB 21 is assumed to include the following areas: an area in which data of the WB 21 is released after the transmission of the data from the WB 21 to the NAND 13; an area in which data remains in the WB 21 after the transmission of the data from the WB 21 to the NAND 13; and an area in which data remains in the WB 21 before the transmission of the data from the WB 21 to the NAND 13. Thus, a logical page is not completed in the NAND 13. In this situation, a read request is assumed to be issued for an LBA corresponding to data in the NAND 13 or an LBA corresponding to data in the WB 21. In this case, data reading from the NAND 13 or data reading from the WB 21 is performed.

"The completion of a logical page" indicates the following state: user data for the logical page has been written to all of the chips included in the logical page of the NAND 13, and the completed L3ECC has been also written to a predetermined chip of the chips included in the logical page. "The incompletion of a logical page" refers to the following three states.

(1) User data for the logical page has not been written to all of the chips included in the logical page. In addition, the completed L3ECC has not been written to a predetermined chip of the chips included in the logical page.

(2) User data for the logical page has been written to all of the chips included in the logical page. However, the completed L3ECC has not been written to a predetermined chip of the chips included in the logical page.

(3) User data for the logical page has not been written to all of the chips included in the logical page. However, the completed L3ECC has been written to a predetermined chip of the chips included in the logical page.

As shown in FIG. 14C, the following situation is assumed: data of the WB 21 is released after the completion of the logical page. In this situation, a read request is assumed to be issued for an LBA corresponding to data in a complete logical page in the NAND 13. In this case, data corresponding to the LBA is read from the NAND 13.

As shown in FIG. 14B, reading from the NAND 13 or reading from the WB 21 happens in response to a read request depending on whether or not the area of the WB 21 has been released. When data is read from the WE 21, an error shall not occur in principle. When data is read from the NAND 13, an error which cannot be corrected by the L1ECC could occur. When this L1ECC error occurs, data which could not be corrected by the L1ECC needs to be corrected by the L3ECC.

As shown in FIG. 14C, all the user data for one logical page are stored in the NAND 13, and the L3ECC is also stored in the NAND 13. In this situation, an L1ECC error is assumed to occur in the data read from the NAND 13. In this case, the data group including the data to be corrected and the L3ECC are read from the NAND 13 and are stored in the L3DEC memory 26. For simplicity, it is assumed that no L1ECC error occurs on reading the data group and the L3ECC at this time. Alternatively, an L1ECC error less than or equal to two symbols may be assumed to be allowable including the correction target. The L3DEC 25 decodes the data group based on the L3ECC in the L3DEC memory 26 and outputs the corrected data.

On the other hand, as shown in FIG. 14B, the following situation is assumed: all the user data for one logical page are not stored in the NAND 13, or the L3ECC is not stored in the NAND 13. On an assumption that all the data for the L3ECC decoding unit are read from the NAND 13, the L3DEC 25 cannot decode the data group in the L3DEC memory 26. Thus, the error of data cannot be corrected.

FIG. 15A and FIG. 15B schematically show a reading process of an L3ECC codeword in a second embodiment. In the second embodiment, the L3DEC 25 does not perform a process until an L3ECC codeword is completely stored in the NAND 13 as shown in FIG. 15B from a state where the L3ECC codeword in the NAND 13 is incomplete as shown in FIG. 15A. Thus, as shown in FIG. 15A, when the logical page is incomplete, an L3ECC code or the entire payload data group of the L3ECC codeword is not stored in the NAND 13. Therefore, the L3DEC 25 does not perform a process until the L3ECC codeword is completely stored in the NAND 13, that is, the logical page is completed. After the L3ECC codeword is completely stored in the NAND 13, the L3ECC and the data group constituting the L3ECC codeword are read from the NAND 13 and are stored in the L3DEC memory 26. The L3DEC 25 performs a decoding process and corrects the error of data based on the data group and the code in the L3DEC memory 26.

FIG. 16 schematically shows the L3ECC decoding process in the second embodiment. The L3ECC decoding process in the second embodiment is performed in parallel with the process for writing a logical page to the NAND 13 shown in the first embodiment. In parallel with the process for writing a logical page to the NAND 13, data for the L3ECC decoding unit in the logical page is read from the NAND 13 to the L3DEC memory 26. However, the configuration is not limited to this example. The process in the second embodiment may be performed after the completion of the processing for writing a logical page.

When a read request is issued from the host 31 for data in the NAND 13, or when reading of data from the NAND 13 is generated in response to a compaction read request, and an L1ECC error occurs, the processing of the L3DEC 25 is started.

The area of the L3DEC memory 26 for the L3ECC decoding unit is initialized by the controller 12 (S21). The area is configured to store an L3ECC codeword with two sector width, composed of an L3ECC code and its corresponding payload data. The size of the area is, for example, (62 symbols+L3ECC)×1 kB.

Subsequently, data for the L3ECC decoding unit is read from the NAND 13 on the basis of, for example, two sectors, and is stored in the L3DEC memory 26 (S22). Subsequently, whether or not the reading of data for the L3ECC decoding unit has been completed is determined (S23). The following factors can be considered when reading has not been completed.

Although writing has been completed, it is taking time to read data. Thus, reading has not been completed.

Writing has not been completed. Thus, all the data which can be read at the moment have been read. However, data for the L3ECC decoding unit has not been completely read.

Writing has not been completed. In addition, data which can be read at the moment has not been completely read.

When reading has not been completed as a result of determination in S23 (NO in S23), a waiting operation is performed until the completion of writing of data for the L3ECC decoding unit to the NAND 13 (S24). If data for the L3ECC decoding unit has been written to the NAND 13, the operation in S22 to S23 is repeated.

When reading of data for the L3ECC decoding unit has been completed as a result of determination in S23 (YES in S23), the L3DEC 25 decodes data stored in the L3DEC memory 26 based on the L3ECC (S25). In other words, the error which could not be corrected with the L1ECC is recovered with the L3ECC.

Subsequently, the L3DEC memory 26 for the L3ECC decoding unit is released (S26).

The data in which the error has been recovered with the L3ECC may be written to the NAND 13. In this manner, when the same data is read from the NAND 13 again, the recurring of an L1ECC error can be prevented.

According to the second embodiment, when data is read from the NAND 13, and an L1ECC error occurred, a waiting operation is performed until the L3ECC codeword is completely stored in the NAND 13. After the completion, a decoding process is performed with the L3ECC. In other words, after the logical page is completed in the NAND 13, and hence data for the L3ECC decoding unit is stored in the L3DEC memory 26, the decoding process with the L3ECC is performed. Thus, in a case where a WB 21 is released with a size less than that of user data for one logical page, and a data read request is issued before the completion of the logical page in the NAND 13, data having an L1ECC error can be certainly corrected with the L3ECC.

The logical page in the NAND 13 shown in FIG. 14A is completed after write commands for the size of user data for the logical page is issued from the host 31. On the other hand, there is no way for the SSD 11 to know when the enough amount of write commands to complete the logical page will be issued by the host 31 beforehand. Thus, it is not possible to know when the logical page will be completed. There is even a possibility that the host 31 does not issue a write command at all. Thus, the read latency may grow large.

Third Embodiment

In a third embodiment, when a data read request is issued for a data in an incomplete logical page being written to the NAND 13, and an L1ECC error has occurred in the data read from the NAND 13, data in the WB 21 is written to the NAND 13 and the logical page is completed forcibly without waiting for completion of the logical page by a write command from the host 31. Subsequently, data for the L3ECC decoding unit is read from the NAND 13, and a decoding process is performed with the L3ECC.

Figure 17:
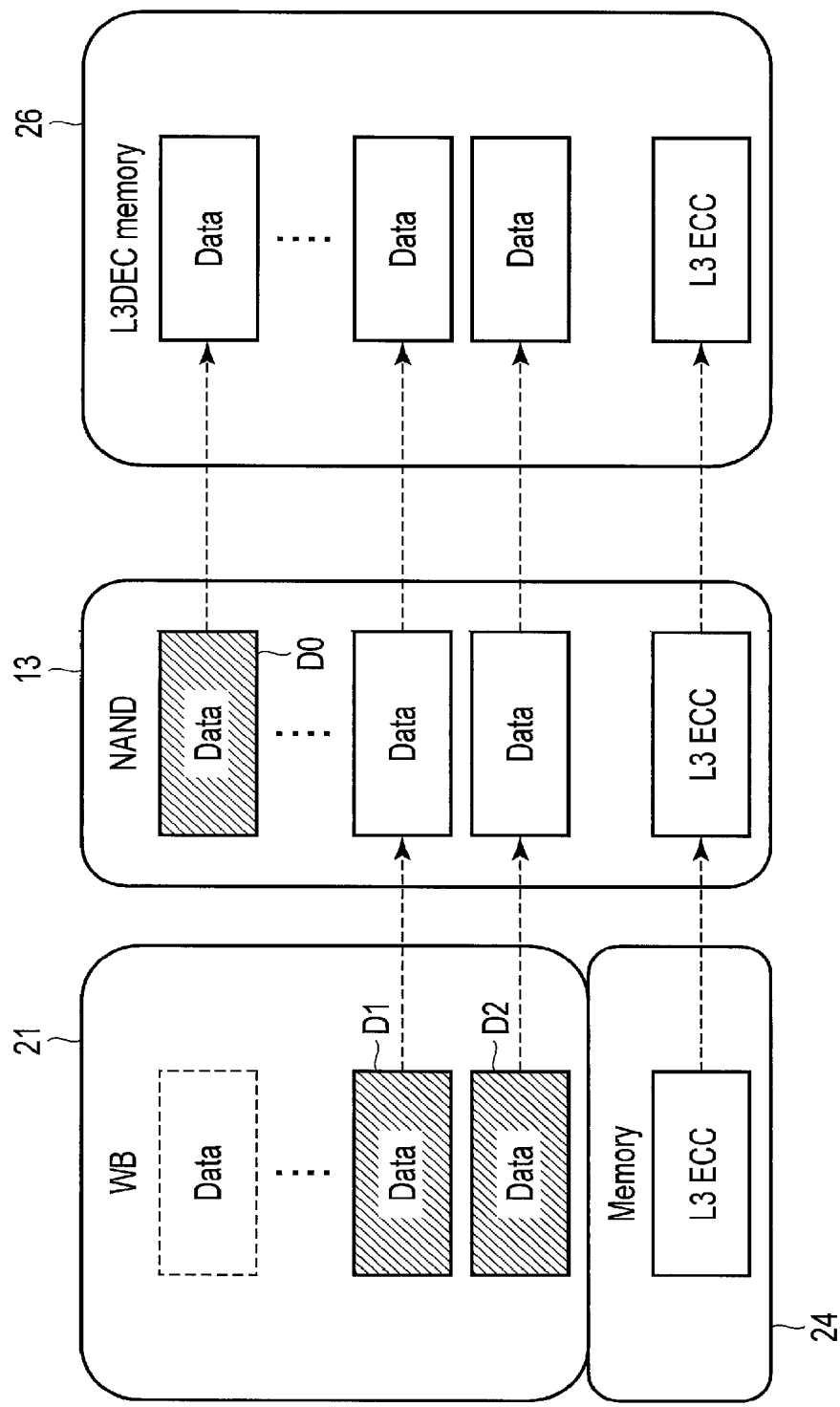
FIG. 17 is shown for schematically explaining a data flow in L3ECC decoding process in a third embodiment.

FIG. 17 schematically shows the data flow in L3ECC decoding process in the third embodiment. It is assumed that data D1 and data D2 which have not been written to the NAND 13 yet are present in the WB 21. Data D0 has already been written to the NAND 13 and the corresponding area has been released in the WB 21. Data D0, D1 and D2 are data transferred from the host 31, in short, user data. For example, the total size of data D1 and D2 is assumed not to have reached the write unit. The L3ECC is a partly-calculated L3ECC held in the L3ENC memory 24.

In this state, when a read request to D0 is issued from the host 31, and an L1ECC error has occurred in the data read from the NAND 13, waiting for the completion of writing of data for the write unit from the host 31 is not performed. Instead, data for the write unit is generated by appending (padding) dummy data generated by the DDG 28 to data D1 and D2 which size has not reached the write unit. The data for the write unit is processed by the L3ENC, and a complete L3ECC is generated. In this manner, user data for the logical page is generated. The generated data is written to the NAND 13. Data D0, D1 and D2 stored in the NAND 13 satisfy the codeword length. Therefore, after data D1, data D2 and dummy data are stored in the NAND 13, data for the L3ECC decoding unit is read from the NAND 13 and is stored in the L3DEC memory 26. Data for read is decoded on the basis of the L3ECC stored in the L3DEC memory 26.

FIG. 18 schematically shows the L3ECC decoding process in the third embodiment.

When, in a state where the logical page is incomplete in the NAND 13, a read request is issued from the host 31 for data in an incomplete logical page in the NAND 13, and an L1ECC error has occurred in the data read area from the NAND 13, the controller 12 initializes an area of the L3DEC memory 26 for the L3ECC decoding unit (S31). Subsequently, data for the L3ECC decoding unit is read from the NAND 13, for example, by two sectors for each chip, and is stored in the L3DEC memory 26 (S32). Subsequently, whether or not the reading of data for the L3ECC decoding unit has been completed is determined (S33). The factors in incompletion of reading are the same as those explained in S23. When reading has not been completed as a result of determination (NO in S33), data which size has not reached the write unit in the WB 21 is padded with dummy data into the write unit. In this manner, data for the write unit is generated. A complete L3ECC is generated for data for the write unit and is written to the NAND 13 (S34). Thus, data for the L3ECC decoding unit can be completed to a logical page. Subsequently, data for the L3ECC decoding unit is read from the NAND 13, for example, by two sectors for each chip, and is stored in the L3DEC memory 26 (S35).

When data for the L3ECC decoding unit is read in S33 (YES in S33), or after data is completely stored in the L3DEC memory 26 in S35, the L3DEC 25 decodes the data stored in the L3DEC memory 26 based on the L3ECC stored in the L3DEC memory 26 (S36). The data error which could not be corrected with the L1ECC is corrected with the L3ECC.

Subsequently, the area in the L3DEC memory 26 for the L3ECC decoding unit is released (S37).

According to the third embodiment, when, in a state where the logical page is incomplete in the NAND 13, a read request is issued for the incomplete logical page, and an L1ECC error has occurred in the data read from the NAND 13, data which size has not reached the write unit in the WB 21 is padded with dummy data into the write unit. In this manner, data for the write unit is generated. A complete L3ECC is generated for the data for the write unit and is written to the NAND 13. Thus, the logical page is forcibly completed. The data for the L3ECC decoding unit is read from the completed logical page to the L3DEC memory 26 and is decoded. Thus, there is no need to wait for the completion of the logical page in the NAND 13 by write commands from the host 31. Thus, it is possible to ensure a response within a certain period in response to the read request from the host 31.

In the third embodiment, it is possible to perform an L3ECC decoding process after forcibly writing data from the WB 21 to the NAND 13 within a certain period. The certain period is made less than or equal to the maximum latency of the SSD 11. Thereby, it is possible to assure the maximum latency and perform an L3ECC decoding process. Thus, it is possible to respond to a read request from the host 31 at high speed.

Fourth Embodiment

In the fourth embodiment, to perform L3DEC, data is collected from the NAND 13, the WB 21 and the L3ENC memory 24 without completing a logical page in the NAND 13, and is stored in the L3DEC memory 26.

In the third embodiment, when a read request is issued for the incomplete logical page in the NAND 13, and an L1ECC error has occurred in the data read from the NAND 13, data which has not reached the write unit in the WB 21 is padded by dummy data. In this manner, data for the write unit is generated. Further, an L3ECC is generated for the data for the write unit, and is written to the NAND 13. There are various states in combination of the data stored in the WB 21 and the data written to the NAND 13.

The following cases (1) to (5) are considered as the state of the data stored in the WB 21 and the NAND 13.

(1) Data has not been transmitted from the host 31 to the WB 21. The data has not been written to the NAND 13.

(2) Data has been stored in the WB 21, has not been written to the NAND 13 yet, and not been encoded by the L3ENC 23 either.

(3) Data has been stored in the WB 21, has not been written to the NAND 13 yet, and has been encoded by the L3ENC 23.

(4) Data has been written to the NAND 13. Corresponding data remains in the WE 21. The data has been encoded by the L3ENC 23.

Although it is not explained in the present embodiment, there may be a case where the state is allowed in which data has been transferred to the NAND 13 and has not been encoded by the L3ENC 23.

(5) Data has been written to the NAND 13. The WB 21 has been released. The data has been encoded by the L3ENC 23.

The necessary conditions to release data in the WB 21 are as follows: data has been encoded by the L3ENC 23, and further has been written to the NAND 13 as defined in case (5). In this case, the state in which data has been written to the NAND 13" includes a state in which data-in has been completed.

The controller 12 manages which data has been L3-encoded and which data has not yet, so they can be distinguished from each other.

When the release granularity of data stored in the WB 21 is less than the size of user data for one logical page, there are various states of the data stored in the WB 21 and the data written to the NAND 13 as explained in cases (1) to (5). In these states, there is a need to respond to a read request from the host 31 by immediately executing the L3DEC.

Figure 19:
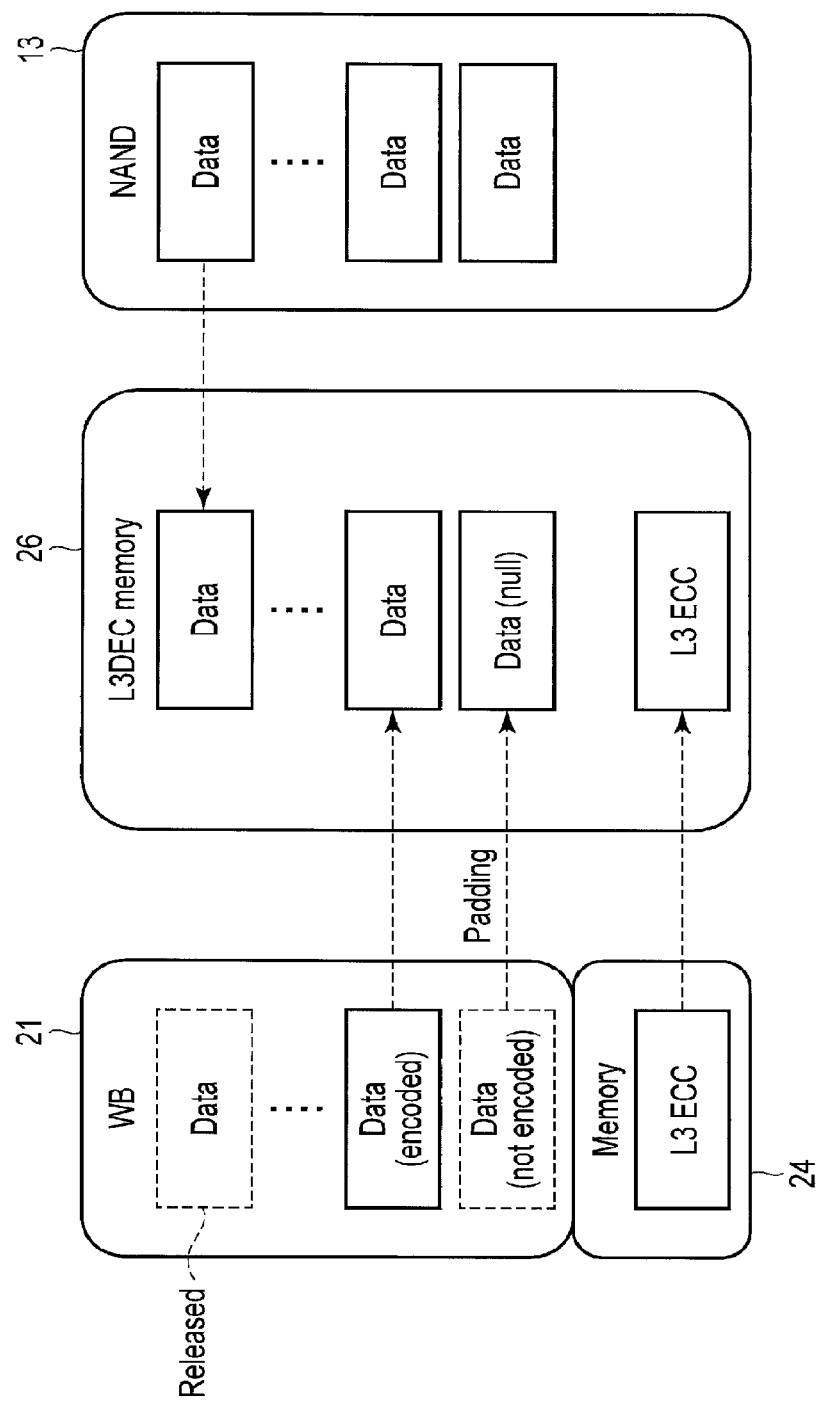
FIG. 19 is shown for schematically explaining a data flow in L3ECC decoding process in a fourth embodiment.

FIG. 19 schematically shows the data flow in L3ECC decoding process in a fourth embodiment. In the fourth embodiment, to perform L3DEC, data is collected from the NAND 13, the WB 21 and the L3ENC memory 24 without completing the logical page, and is stored in the L3DEC memory 26. Among the data for the L3ECC decoding unit where the data requested to be read is included, the data stored in the NAND 13 (in a case where a state in which data has been written into the NAND 13 and has not been L3-encoded yet is allowed, the data here is limited to the one L3-encoded; here "written into the NAND 13" means either programmed or transferred (data-in)) is read from the NAND 13, and is transferred into the L3DEC memory 26. In other words, among the data written in the NAND 13, only the data processed by the L3ENC is read from the NAND 13, and is stored into the L3DEC memory 26.

Data which has been stored in the WB 21 and has been L3-encoded is read from the WB 21, and is stored in the L3DEC memory 26. Data which has been stored in the WB 21 and has not been L3-encoded yet is not transferred to the L3DEC memory 26. Instead, dummy data, for example, null data is stored in the L3DEC memory 26. Further, a partly-calculated L3ECC stored in the L3ENC memory 24 is stored in the L3DEC memory 26. In this manner, data for the L3ECC decoding unit is stored in the L3DEC memory 26. A decoding process is performed based on the data for the L3ECC decoding unit stored in the L3DEC memory 26. Thus, the data error which could not be corrected with the L1ECC is corrected.

FIG. 20 schematically shows an L3ECC decoding process in the fourth embodiment.

When a read request is issued from the host 31 for data in the NAND 13, and an L1ECC error has occurred in the data read from the NAND 13, the controller 12 initializes an area of the L3DEC memory 26 for the L3ECC decoding unit (S41). Subsequently, data for the L3ECC decoding unit (including the L3ECC) is read from the NAND 13, and is stored in the L3DEC memory 26 (S42). Subsequently, whether or not the storing data for the L3ECC decoding unit in the L3DEC memory 26 has been completed is determined (S43). When the storing has not been completed as a result of determination (NO in S43), the L3-encoded data held by the WB 21 and the partly-calculated L3ECC stored in the L3ENC memory 24 are stored in the L3DEC memory 26 (S44). Among the data in the WB 21, data which has not been L3-encoded yet is not transferred to the L3DEC memory 26. Instead, null data as dummy data supplied from the dummy data generator (DDG) 28 is stored in the L3DEC memory 26 via, for example, the WB 21 (S45). Null data may be stored in the L3DEC memory 26 without the intervention of the WB 21. When the L3DEC memory 26 is initialized by null data in the initialization process in S41, the processing in S45 can be omitted.

When storing data for the L3ECC decoding unit in the L3DEC memory 26 is completed (YES in S43), data for the L3ECC decoding unit in the L3DEC memory 26 is decoded by the L3DEC 25 (S46). In this manner, the data error which could not be corrected by the L1ECC is corrected. The corrected data is transferred to the host 31 via the RB 27.

According to the fourth embodiment, when a read request is issued in a state where the logical page is incomplete in the NAND 13, and an L1ECC error has occurred, the data stored in the NAND 13 on the incomplete logical page, the L3-encoded data in the WB 21, and the partly-calculated L3ECC in the L3ENC memory 24 are transferred into the L3DEC memory 26. With regard to the data which is held by the WB 21 and is not L3-encoded, dummy data is stored in the L3DEC memory 26. Thus, data for the L3ECC decoding unit is completed in the L3DEC memory 26. L3-decoding is performed on the basis of the completed data for the L3ECC decoding unit. Thus, in the fourth embodiment, there is no need to write data from the WB 21 or the L3ENC memory 24 to the NAND 13 in order to perform L3 decoding in a manner different from that of the third embodiment. Thus, in the fourth embodiment, an L3-decoding process can be performed at higher speed than in the third embodiment.

Fifth Embodiment

The first to fourth embodiments are explained with regard to examples for solving the problems created upon trying to improve the use efficiency of the WB 21. However, the situation in which the correction by the L3ECC is required when the logical page is incomplete is not limited to a case where the release unit of the WB 21 is less than the size of user data for one logical page. For example, a similar situation occurs when the power source 32 is turned off while data is being written to the NAND 13.

Even when the power source 32 is turned off, the SSD 11 needs to ensure persistence of data which was transferred from the host 31 to the WB 21 and sent a response indicating that the writing had been completed to the host 31. Therefore, it is necessary to non-volatilize data which is held in the WB 21 and is not written to the NAND 13 (user data area 13*a*) in a state where the power source 32 is turned off. It takes a long time to write user data for one logical page held in the WB 21 to the NAND 13. Specifically, a time for programming MLC and TLC is longer than that of SLC. Thus, a back-up power source with a large capacity is required.

In a fifth embodiment, if the logical page in the NAND 13 is incomplete when the power source 32 is turned off, the logical page is left in an incomplete state. After the power source 32 is turned on, the data contained in the incomplete logical page is rewritten into a new logical page. When data is read from the incomplete logical page of the NAND 13 after the power source 32 is turned on, an L1ECC error may occur. Thus, the error correction is applied to the incomplete logical page, using the L3ECC. To enable this, when the power source 32 is turned off, the data held in the WB 21 and the partly-calculated L3ECC are stored in the save area 13*b* of the NAND 13 shown in FIG. 3.

As shown in FIG. 1, the SSD 11 comprises the power source controller 29 and the backup power source 14. When the power source 32 is turned off, the function is maintained for a certain period by the backup power source 14. During this period, the data in the WB 21 and the partly-calculated L3ECC are saved in the save area 13*b* of the NAND 13.

FIG. 21 schematically shows the operation which is performed when the power source 32 is turned off according to the fifth embodiment. When the power source controller 29 detects the power-off of the power source 32 (YES in S51), the power supply is switched from the power source 32 to the backup power source 14 (S52). During the backup by the backup power source 14, the controller 12 writes the partly-calculated L3ECC held in the L3ENC memory 24 and the data which is stored in the WB 21 and is used for the calculation of the L3ECC to the save area 13*b* of the NAND 13 (S53).

Figure 22:
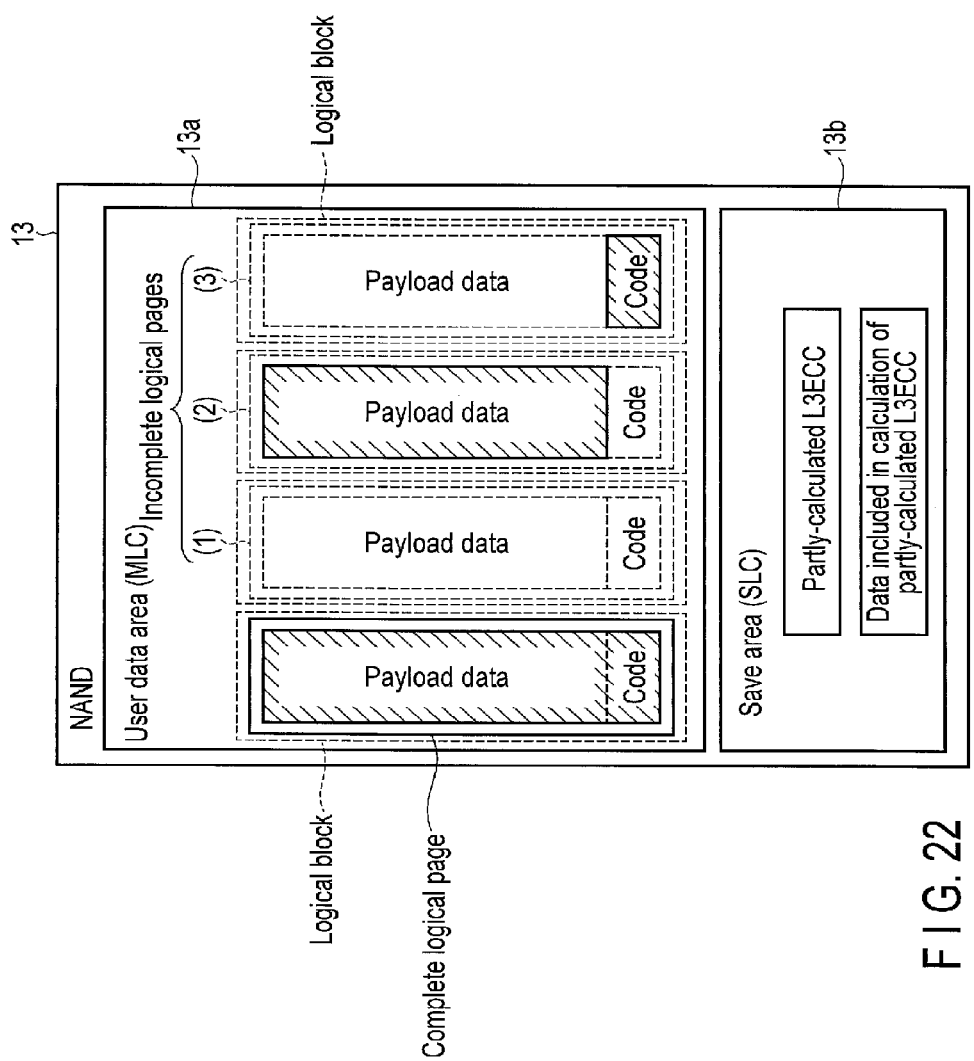
FIG. 22 schematically shows a state of a nonvolatile memory after the power source is turned off.

FIG. 22 schematically shows the state of the NAND 13 after the power source 32 is turned off. The partly-calculated L3ECC and the data used to calculate the L3ECC are stored in the save area 13*b*. If the logical page in the user data area 13*a* of the NAND 13 is incomplete when the power source 32 is turned off, the logical page is left in the incomplete state. The following three cases are considered as the state of the incomplete logical page as stated above.

(1) User data for one logical page is incomplete, and the L3ECC is also incomplete.

(2) User data for one logical page is complete, but the L3ECC is incomplete.

(3) User data for one logical page is incomplete, but the L3ECC is complete.

The save area 13*b* is composed of SLC blocks as described above. Thus, it is possible to write data at higher speed than MLC blocks. Therefore, it is possible to write data within a limited period by the backup power source 14.

FIG. 23 schematically shows the processing which is performed after the power source 32 is turned on according to the fifth embodiment. After the power source 32 is turned on, the SSD 11 performs, for example, a refresh operation as one of the boot up operations. In this refresh operation, the logical page which was stored in the user data area 13*a* of the NAND 13 and was incomplete when the power source 32 was turned off is processed. However, the processing of the incomplete logical page is not limited to a refresh operation. The process of the incomplete logical page may be performed when a read request is issued from the host 31 or in a compaction process in association with garbage collection.

As shown in FIG. 23, after the refresh operation is started, the user data of the incomplete logical page stored in the user data area 13*a* of the NAND 13 is read. The L1DEC 22*b* performs L1 decoding, using the L1ECC (S61).

Subsequently, whether or not L1 decoding has been successful is determined (S62). In other words, whether or not an L1ECC error has occurred is determined. When L1 decoding has been successful as a result of determination (YES in S62), for example, the decoded data is stored in the WB 21 (S67).

When L1 decoding has been unsuccessful (NO in S62), the partly-calculated L3ECC stored in the save area 13b of the NAND 13, and the data used for the calculation of the L3ECC are read and are transferred to the L3DEC memory 26 (S63). Data for the L3ECC decoding unit including the correction target data of the incomplete logical page is read from the NAND 13 and is transferred to the L3DEC memory 26 (S64). The processing for collecting various types of data in the L3DEC memory 26 is substantially the same as that of the fourth embodiment. When data for the L3ECC decoding unit does not satisfy the codeword length in the L3DEC memory 26, the rest of the area is padded with a dummy data, for example, a null data.

In a state where the data for the L3ECC decoding unit and the L3ECC are stored in the L3DEC memory 26, the L3DEC 25 performs L3 decoding to the data for the L3ECC decoding unit, using the L3ECC (S65). Subsequently, whether or not L3 decoding has been successful is determined (S66). Thus, whether or not the error which could not be corrected with the L1ECC has been corrected by L3 decoding is determined. When L3 decoding has been successful as a result of determination (YES in S66), for example, the corrected data is stored in the WB 21 (S67). The data stored in the WB 21 is written to an area different from the incomplete logical page of the NAND 13 by an operation similar to the above writing operation (S68).

As shown in FIG. 24, to complete the logical page, the data stored in the WB 21 which includes the corrected data is not written to the same logical page as the incomplete logical page at the power-off. Instead, the data is written to a new logical block LB2 different from a logical block LB1 in which the incomplete logical page is stored. In this manner, the logical page is completed. The reason is as follows. When a memory cell in NAND is programmed after a long time since it has been erased, reliability of the data programmed in the memory cell may be decreased. Moreover, when the power-off occurs, it cannot be detected how much time has passed from the power-off.

When L3 decoding has been unsuccessful (NO in S66), the fact that the LBA cannot be corrected is recorded (S69). Subsequently, when a read request is issued for the LBA from the host 31, the host 31 is notified of the uncorrectable error.

The data stored in the save area 13b of the NAND 13 is erased after the execution of the above L3 decoding.

According to the fifth embodiment, when the power source 32 is turned off, the logical page which is stored in the NAND 13 and is in the middle of writing is left in the incomplete state. The data held by the WB 21 and the partly-calculated L3ECC held by the L3ENC memory 24 are stored in the save area 13b of the NAND 13. After the power source 32 is turned on, user data is read from the incomplete logical page of the NAND 13. When L1 decoding has been unsuccessful, the partly-calculated L3ECC stored in the save area 13b of the NAND 13 and the data used for the calculation are read, and user data is read from the incomplete logical page stored in the user data area 13a. Using these data, L3 decoding is performed to correct the error. In this manner, even when the power source 32 is turned off, the persistence of the data for which a response indicating the completion of writing to the host 31 has been sent is ensured.

Sixth Embodiment

Figure 25:
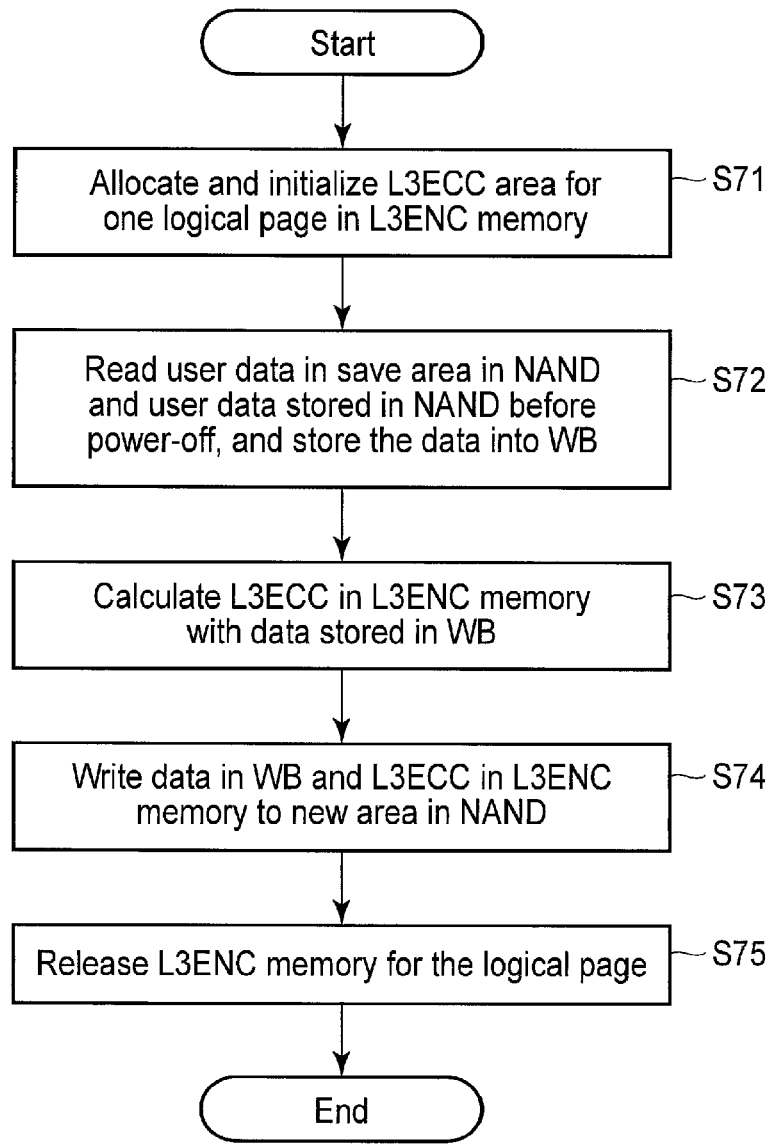
FIG. 25 is a flowchart schematically showing a decoding process and a refresh process after a power source is turned on according to a sixth embodiment.

FIG. 25 is applied to a sixth embodiment, and shows an example in which the data written to the user data area 13a of the NAND 13 before the power-off (the state where the power is not supplied) of the power source 32 and the data saved in the save area 13b are rewritten to a new logical block in the user area 13a after the power source 32 is turned on. In a manner similar to that of the fifth embodiment, the process of the sixth embodiment may be performed when a read request is issued from the host 31 and an L1ECC error occurs, in a compaction process, or in the boot up operation.

As shown in FIG. 25, after the power source 32 is turned on, the controller 12 allocates an area for the L3ECC for one logical page in the L3ENC memory 24 and initializes the area (S71). Subsequently, the data (user data) held in the save area 13b in the NAND 13, and the data written to the user data area 13a of the NAND 13 before the power-off of the power source 32 are read, and are stored in the WB 21 (S72). At this time, the data read from the NAND 13 (the MLC area 13a and the SLC area 13b) is decoded with the L1ECC by the L1DEC 22b. When an L1ECC error has occurred in L1 decoding, in a manner similar to that of the fifth embodiment, the data error is corrected with the L3ECC.

Subsequently, the L3ECC is calculated by the L3ENC 23 based on the data stored in the WB 21. Thus, the L3ECC in the L3ENC memory 24 is updated (S73). This operation is applied to user data for one logical page stored in the WB 21.

The user data for one logical page in the WB 21 and the L3ECC in the L3ENC memory 24 are stored in a new logical block (LB2) in the user data area 13a of the NAND 13 as shown in FIG. 24 (S74). In this manner, the complete logical page is stored in the user data area 13a of the NAND 13.

Subsequently, the L3ECC area for one logical page in the L3ENC memory 24 is released (S75).

According to the sixth embodiment, after the power source 32 is turned on, user data is read from the logical page which is incomplete at the time of the power-off of the power source 32, and is stored in the WB 21. Using this data, the L3ECC is calculated by the L3ENC 23, and the data contained in the incomplete logical page is rewritten to a new logical page. Thus, it is possible to ensure persistence of write data and reduce the number of incomplete logical pages. On the contrary, the cost to manage the locations of incomplete logical pages and corresponding L3ECC is reduced, if the number of incomplete logical pages is large. Thus, the processing of the controller 12 can be reduced.

Seventh Embodiment

Figure 26:
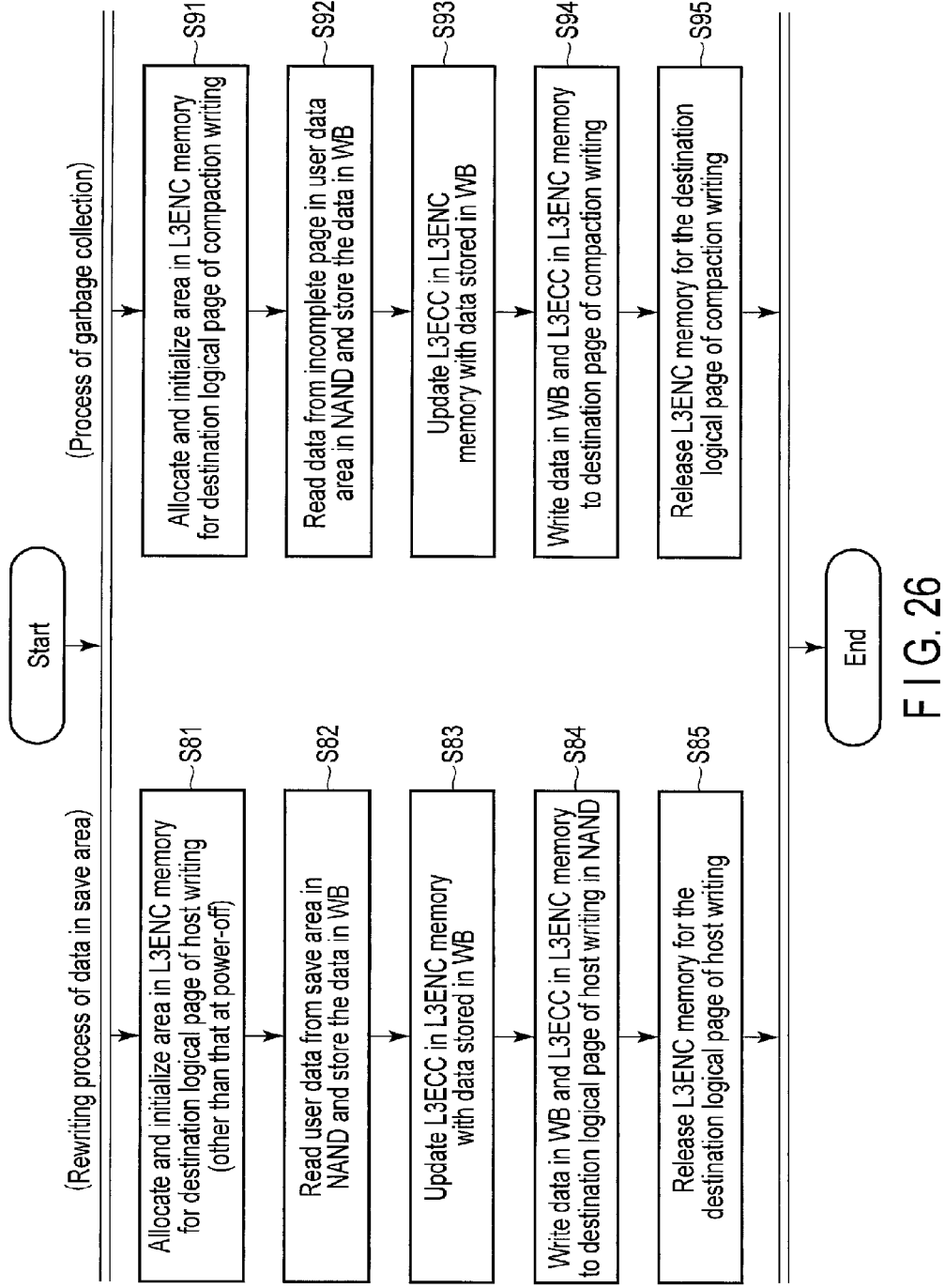
FIG. 26 is a flowchart schematically showing a decoding process and a refresh process after a power source is turned on according to a seventh embodiment.

FIG. 26 shows a seventh embodiment. In a manner similar to that of the sixth embodiment, the seventh embodiment shows the operation which is performed when the power source 32 is turned on in the SSD 11.

FIG. 26 shows an example in which the data stored in the save area 13b is stored in the block of the user data area 13a of the NAND 13 (S81 to S85), and an example in which the data stored in the user data area 13a of the NAND 13 before the power-off of the power source 32 is stored in a destination block for compaction writing (S91 to S95).

In FIG. 26, the processing of data stored in the save area 13b (S81 to S85) and the process of data stored in the user data area 13a (S91 to S95) are applied to different blocks. Thus, these processes can be performed in parallel with each other. However, the present embodiment is not limited to this configuration. These processes may be performed sequentially.

In the processing of data stored in the save area 13b, the controller 12 allocates an area for the L3ECC for one logical page in the L3ENC memory 24 and initializes the area (S81). Subsequently, the user data held in the save area 13b in the NAND 13 is read, and is stored in the WB 21 (S82).

Subsequently, the L3ECC is calculated by the L3ENC 23 based on the data stored in the WB 21. The L3ECC for the L3ENC memory 24 is updated (S83).

The data in the WB 21 and the L3ECC in the L3ENC memory 24 are stored in a new logical block in the user data area 13a of the NAND 13 (S84). Subsequently, the L3ECC area of the L3ENC memory 24 for one logical page is released (S85).

In order to rewrite the data stored in the user data area 13a into a destination block for compaction writing, the controller 12 allocates an L3ECC area for one logical page in the L3ENC memory 24 and initializes the area (S91). Subsequently, the user data stored in the user data area 13a of the NAND 13 before the power-off of the power source 32 is read, and is stored in the WB 21 (S92).

Subsequently, the L3ECC is calculated by the L3ENC 23 based on the data stored in the WB 21. The L3ECC of the L3ENC memory 24 is updated (S93).

The data in the WB 21 and the L3ECC in the L3ENC memory 24 are written into a destination block for compaction writing in the user data area 13a of the NAND 13 (S94). Subsequently, the L3ECC area of the L3ENC memory 24 for one logical page is released (S95).

The seventh embodiment also realizes the persistence of data which is written before the power source 32 is turned off. In addition, in the seventh embodiment, when the power source 32 is turned off, the data stored in the save area 13b and the data written to the user data area 13a of the NAND 13 are stored in different areas in the user data area 13a. Thus, implementation is easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a first volatile memory configured to store data;
a nonvolatile memory comprising a plurality of chips; and
a controller configured to control the first volatile memory and the nonvolatile memory,
allocate an area of the first volatile memory to store first data,
store the first data in the allocated area in temporary,
write the first data stored in the area along with a first error correcting code into the nonvolatile memory to form a first data group over the plurality of chips,
the first data group including a plurality of items of data and a second error correcting code,
the plurality of items of data being to include the first data,
and
release the area storing the first data before completing of writing all of the plurality of items of data of the first data group into the nonvolatile memory,
wherein:
the first error correcting code is generated using the first data, and is a code to correct an error in the first data, and
the second error correcting code is generated using the plurality of items of data included in the first data group, and is a code to correct an error in one of the plurality of items of data, the error being not able to be corrected with a first error correcting code associated with the one of the plurality of items of data.

2. The system according to claim 1, wherein
the first data group further includes one or more codewords,
a first codeword included in the codewords includes the plurality of the items of data and the second error correcting code, generating the second error correcting code by using the plurality of items of data in the first data group further comprises updating a partly-calculated second error correcting code on the basis of each of the plurality of items of data, and
the controller updates the partly-calculated second error correcting code on the basis of the first data stored in the area of the first volatile memory before releasing the area.

3. The system according to claim 2, wherein
the controller further receives a write command associated with the first data from a host and stores the received first data in the allocated area of the first volatile memory, and
in a case where an item of data included in the first codeword in the nonvolatile memory is requested to be read and an error in the read data cannot be corrected by a first error correcting code associated with the read data before completing of writing the first codeword in the nonvolatile memory,
the controller writes a second data stored in the first volatile memory by a first write command from the host to the nonvolatile memory and completes writing of the first codeword.

4. The system according to claim 2, wherein
in a case where an item of data included in the first codeword in the nonvolatile memory is requested to be read and an error in the read data cannot be corrected by a first error correcting code associated with the read data before completing of writing the first codeword in the nonvolatile memory,
the controller appends dummy data to the data stored in the first volatile memory in order to satisfy a size of the first data group, writes data to which the dummy data is appended to the nonvolatile memory, and completes the first data group in the nonvolatile memory.

5. The system according to claim 4, further comprising a generator configured to generate the dummy data for satisfying the size of the first data group.

6. The system according to claim 5, wherein
the dummy data is data which does not change the second error correcting code by the appending.

7. The system according to claim 2, further comprising a second volatile memory, wherein
in a case where an item of data included in the first codeword in the nonvolatile memory is requested to be read and an error in the read data cannot be corrected by a first error correcting code associated with the read data before completing of writing the first codeword in the nonvolatile memory,
the controller
reads into the second volatile memory, an item of the plurality of data which is used in the updating of the partly-calculated second error correcting code and is written in the first nonvolatile memory, the partly-calculated second error correcting code being updated to generate the second error correcting code in the first codeword, stores, in the second volatile memory, the partly-calculated second error correcting code, and corrects the error in the read data on the basis of the partly-calculated second error correcting code stored in the second volatile memory.

8. The system according to claim 2, further comprising:

a detector which detects whether a power source is turned on; and a backup power source which supplies power to the controller, the first volatile memory and the nonvolatile memory for a certain period when the detector detects that the power source is not supplied, wherein the nonvolatile memory includes a first area and a second area, and the first data group is written in the first area, and when the detector detects that the power source is not supplied, the controller writes, to the second area, the partly-calculated second error correcting code and an item of data being to be included in the first data group which is stored in the first volatile memory and is used in the updating of the partly-calculated second error correcting code.

9. The system according to claim 8, wherein the first area of the nonvolatile memory stores data of a plurality of bits in a memory cell, and the second area stores data of one bit in a memory cell.

10. The system according to claim 9, wherein in a case where an item of data included in the first codeword written in the first area of the nonvolatile memory is read and an error in the read data cannot be corrected by a first error correcting code associated with the read data after transition from a state where the power source is not supplied to a state where the power source is supplied, the controller corrects the error in the read data on the basis of the partly-calculated second error correcting code written in the second area and at least the item of data used in the updating of the partly-calculated second error correcting code.

11. The system according to claim 9, wherein the nonvolatile memory includes first and second logical blocks each comprising a plurality of physical blocks included in the chips, and after transition from a state where the power source is not supplied to a state where the power source is supplied, the controller reads, into the first volatile memory, the plurality of items of data included in the first data group written in the first area and the item of data written in the second area, generates at least one second error correcting code using the plurality of items of data and the item of data stored in the first volatile memory, and writes the plurality of items of data, the item of data and the generated second error correcting code to the first area into the second logical block, the second logical block being different from the first logical block in which at least a part of the first data group has been written in the first area before power-off.

12. The system according to claim 9, wherein the nonvolatile memory includes first and second logical blocks each comprising a plurality of physical blocks included in the chips, after transition from a state where the power source is not supplied to a state where the power source is supplied, the controller reads, in the first volatile memory, the item of data written in the second area, generates a second error correcting code using the item of data stored in the first volatile memory, and writes the item of data and the generated second error correcting code to the first area, and in a garbage collection process, the controller reads the plurality of items of data included in the first data group written in the first area into the plurality of items of data in the first volatile memory, generates the second error correcting code using the plurality of items of data stored in the first volatile memory, and writes the plurality of items of data and the generated second error correcting code to the second logical block different from the first logical block in which the plurality of items of data included in the first data group has been written in the first area before power-off.

13. A memory system comprising:

a volatile memory configured to store data;

a nonvolatile memory comprising a plurality of chips; and a controller configured to:

control the volatile memory and the nonvolatile memory, allocate an area of the volatile memory to store first data, store first data in the allocated area in temporary, transmit the first data stored in the area along with a first error correcting code into the nonvolatile memory to form a first data group over the plurality of chips, the first data group including a plurality of items of data and a second error correcting code, the plurality of items of data being to include the first data, and release the area storing the first data after transmission of the first data into a chip of the plurality of chips of the nonvolatile memory without waiting for completion of all of program operations of the first data group performed by the plurality of chips, wherein:

the first error correcting code is generated using the first data, and is a code to correct an error in the first data, and the second error correcting code is generated using the plurality of items of data included in the first data group, and is a code to correct an error in one of the plurality of items of data, the error being not able to be corrected with a first error correcting code associated with the one of the plurality of items of data.

14. The system according to claim 13, wherein the controller further confirms success or failure of each of the program operations of the first data performed by the plurality of chips, and when a program operation of the first data is failed, recovers data lost due to the failure of the program operation using a second error correcting code corresponding to the lost data, and writes the recovered data to the nonvolatile memory.

15. The system according to claim 14, wherein when a second data different from the data of the first data group is lost due to the failure in the program operation of the first data, the controller further recovers, using a second error correcting code corresponding to the second data, at least one of the first data of which the program operation is failed and the second data which is lost by being involved in the failure of the program operation of the first data, and writes the recovered data to the nonvolatile memory.

16. The system according to claim 15, wherein the nonvolatile memory is allowed to store data of a plurality of bits in a memory cell, and the second data is data which is programmed in a same memory cell as a memory cell in which the program operation of the first data is failed.

17. The system according to claim 15, wherein the nonvolatile memory includes a first word line and a second word line adjacent to the first word line, and the second data is data stored in a memory cell connected to the second word line, and the program operation of the first data is failed in the first word line.

18. The system according to claim 15, wherein the nonvolatile memory includes first and second planes which can be programmed parallelly, and the second data is data which is programmed to the second plane in parallel with the failed program operation of the first data to the first plane.

19. A memory system comprising:
a volatile memory configured to store data;
a nonvolatile memory comprising a plurality of chips; and
a controller configured to:
control the volatile memory and the nonvolatile memory,
allocate an area of the volatile memory to store first data,
store the first data in the allocated area in temporary,
write the first data stored in the area along with a first error correcting code into the nonvolatile memory to form a first data group over the plurality of chips,
the first data group including a plurality of items of data and a second error correcting code,
the plurality of items of data being to include the first data,
and
release the area storing the first data,
wherein:
the first error correcting code is generated using the first data, and is a code to correct an error in the data, and
the second error correcting code is generated using the plurality of items of data of the first data group, and is a code to correct an error in one of the plurality of items of data, the error being not able to be corrected with a first error correcting code associated with the one of the plurality of items of data.

20. The system according to claim 19, wherein in a case where an item of data included in the plurality of items of data in the first data group is requested to be read and an error in the read data cannot be corrected by a first error correcting code associated with the read data before completing of writing the first data group in the nonvolatile memory,
the controller writes, to the nonvolatile memory, a second data stored in the volatile memory by a write command from a host to the nonvolatile memory, and completes the first data group in the nonvolatile memory.

* * * * *